United States Patent
Tang

(10) Patent No.: US 8,931,169 B2
(45) Date of Patent: *Jan. 13, 2015

(54) METHODS OF FABRICATING COMPONENTS FOR MICROELECTRONIC DEVICES

(75) Inventor: Sanh Dang Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/560,836

(22) Filed: Jul. 27, 2012

(65) Prior Publication Data

US 2012/0285926 A1   Nov. 15, 2012

Related U.S. Application Data

(60) Division of application No. 12/888,911, filed on Sep. 23, 2010, now Pat. No. 8,234,782, which is a division of application No. 11/542,706, filed on Oct. 3, 2006, now Pat. No. 7,814,650, which is a continuation of
(Continued)

(51) Int. Cl.
*H01L 27/10* (2006.01)
*H05K 3/10* (2006.01)
*H01L 27/108* (2006.01)
(Continued)

(52) U.S. Cl.
CPC .... *H01L 27/10885* (2013.01); *H01L 21/76831* (2013.01); *H01L 21/76897* (2013.01); *H01L 27/10855* (2013.01); *H01L 27/10888* (2013.01); *H01L 27/1052* (2013.01)
USPC ................... 29/852; 29/847; 29/874; 29/887; 438/622; 438/637; 438/639

(58) Field of Classification Search
USPC ............ 29/852, 874, 887, 847; 438/622, 637, 438/639, 654, 700, 706, 735; 257/302, 365, 257/390, E27.091, E27.097

See application file for complete search history.

(56) References Cited

U.S. PATENT DOCUMENTS 5,032,882 A * 7/1991 Okumura et al. ............. 257/302
5,369,049 A 11/1994 Acocella et al.
(Continued)

FOREIGN PATENT DOCUMENTS

JP   59004046 A   1/1984
JP   62155557 A * 7/1987 ............ 257/E27.091
(Continued)

OTHER PUBLICATIONS

Nakamura, Kunio, "Semiconductor Memory Device" (Certified English Translation of JP 62-155557), pp. 1-13, Apr. 2014.*

*Primary Examiner* — A. Dexter Tugbang
(74) *Attorney, Agent, or Firm* — Perkins Coie LLP

(57) ABSTRACT

Methods of fabricating components for microelectronic devices are described herein. For example, one embodiment is directed toward a method of fabricating a memory cell on a workpiece having a substrate, a plurality of active areas in the substrate, and a dielectric layer over the active areas. Bit line contact openings can be formed in the dielectric layer over first portions of the active areas and cell plug openings over second portions of the active areas. A first conductive material is deposited into the bit line contact openings to form bit line contacts and into the cell plug openings to form cell plugs. A conductive line is formed in a trench in the substrate. Dielectric features can electrically insulate the conductive line.

8 Claims, 20 Drawing Sheets

Related U.S. Application Data application No. 10/785,438, filed on Feb. 24, 2004, now Pat. No. 7,115,928, which is a division of application No. 10/225,584, filed on Aug. 21, 2002, now Pat. No. 6,696,339.

(51) Int. Cl.
*H01L 21/768* (2006.01)
*H01L 27/105* (2006.01)

(56) References Cited

U.S. PATENT DOCUMENTS

| | | |
|---|---|---|
| 5,821,591 A | 10/1998 | Krautschneider et al. |
| 5,918,120 A | 6/1999 | Huang |
| 5,990,021 A | 11/1999 | Prall et al. |
| 6,008,513 A | 12/1999 | Chen |
| 6,026,010 A | 2/2000 | Ema et al. |
| 6,054,394 A | 4/2000 | Wang |
| 6,200,898 B1 * | 3/2001 | Tu .............................. 438/706 X |
| 6,285,045 B1 | 9/2001 | Itabashi et al. |
| 6,300,213 B1 | 10/2001 | Dennison |
| 6,329,255 B1 | 12/2001 | Gau |
| 6,376,380 B1 | 4/2002 | Tang et al. |
| 6,413,817 B1 | 7/2002 | Liao et al. |
| 6,479,377 B1 | 11/2002 | Tang et al. |
| 6,511,879 B1 | 1/2003 | Drynan |
| 6,649,501 B2 | 11/2003 | Lee et al. |
| 6,696,339 B1 | 2/2004 | Tang |
| 7,115,928 B2 | 10/2006 | Tang |
| 2002/0053694 A1 | 5/2002 | Sutcliffe |
| 2003/0040188 A1 | 2/2003 | Hsu et al. |
| 2007/0022601 A1 | 2/2007 | Tang |
| 2011/0005070 A1 | 1/2011 | Tang |

FOREIGN PATENT DOCUMENTS

| | | |
|---|---|---|
| JP | 06338596 A | 12/1994 |
| JP | 2000150829 A * | 5/2000 |

* cited by examiner

METHODS OF FABRICATING COMPONENTS FOR MICROELECTRONIC DEVICES

CROSS-REFERENCE TO RELATED APPLICATIONS

This application is a divisional of U.S. application Ser. No. 12/888,911 filed Sep. 23, 2010, now U.S. Pat. No. 8,234,782, which is a divisional of U.S. application Ser. No. 11/542,706 filed Oct. 3, 2006, now U.S. Pat. No. 7,814,650, which is a continuation of U.S. application Ser. No. 10/785,438 filed Feb. 24, 2004, now U.S. Pat. No. 7,115,928, which is a divisional of U.S. application Ser. No. 10/225,584 filed Aug. 21, 2002, now U.S. Pat. No. 6,696,339, each of which is incorporated herein by reference in its entirety.

TECHNICAL FIELD

The present invention is directed to fabricating conductive structures, such as bit lines and interlayer contacts, in the manufacturing of microelectronic devices.

BACKGROUND

Manufacturers of microelectronic devices are continually reducing the size and increasing the density of components in integrated circuits to (a) increase the speed and capacity of devices and (b) reduce the power consumption. For example, to increase the capacity of a memory device, it is desirable to reduce the size of memory cells without impairing performance. Memory device manufacturers accordingly seek to reduce the size and/or increase the density of components in memory cells.

Memory cells include integrated circuitry comprised of several different submicron components, such as active areas, bit lines, wordlines, bit line contacts and cell plugs. The bit lines, wordlines and other components are electrically coupled to appropriate contact areas by the bit line contacts and cell plugs. As integrated circuits are scaled down, it becomes more difficult to fabricate the individual components. The increasing difficulty of fabricating small components increases the cost of fabricating integrated circuits. For example, as memory cells shrink, several micro-fabrication processes require extensive development to form such small structures with the necessary precision and repeatability for production level processing. The equipment and procedures for producing ever smaller components accordingly becomes more expensive.

One process that may become a limiting factor for producing small components in high-performance devices is photolithography. Photolithographic processes dramatically increase the cost of manufacturing a given device because they are time-consuming and require very expensive equipment. For example, a conventional bit line structure requires several photolithographic procedures to form the bit lines, the bit line contacts between the bit lines and the active areas, and the cell plugs that are electrically connected to other portions of the active areas. To better understand the problems with conventional techniques for fabricating bit lines in memory cells, FIGS. 1-8B illustrate a conventional process for fabricating raised bit lines.

FIG. 1 is a top plan view illustrating a portion of a memory cell array 10. The memory cell array 10 includes a dielectric layer 20, a plurality of bit line openings 22 extending through the dielectric layer 20, and a plurality of cell plug openings 24 extending through other portions of the dielectric layer. FIGS. 2A, 3A, 4A, 5A, 6A, 7A and 8A are all schematic cross-sectional views taken along line A-A of FIG. 1 at various stages of forming a bit line structure using conventional processing techniques. FIGS. 2B, 3B, 4B, 5B, 6B, 7B and 8B are schematic cross-sectional views taken along B-B of FIG. 1 at corresponding stages of fabricating a bit line structure in a memory cell in accordance with conventional techniques.

Referring to FIGS. 2A and 2B, the memory cell 10 includes a substrate 12 having a plurality of shallow trench isolation (STI) structures 14 and active areas 16 (identified by reference numbers 16a and 16b) between the STI structures 14. In FIG. 2A, the STI structures 14 separate bit line active areas 16a, and in FIG. 2B, the STI structures 14 separate cell active areas 16b. FIGS. 2A and 2B illustrate the memory cell 10 after a conductive material 30 has been deposited into the bit line openings 22 and the cell plug openings 24. The conductive layer 30 is planarized to form bit line contacts 32 in the bit line openings 22 and cell plugs 34 in the cell plug openings 24. An oxide layer 40 is then deposited over the workpiece.

FIGS. 3A-5B are schematic cross-sectional views of subsequent stages in the conventional method that illustrate constructing bit lines for the memory cell 10. Referring to FIGS. 3A and 3B, the oxide layer is patterned using a first photolithographic process and then openings 42 are etched in the oxide layer 40 over only the bit line contacts 32. The oxide layer 40 is not removed over the cell plugs 34. Referring to FIGS. 4A and 4B, a first conductive layer 50 is deposited on the workpiece and then a second conductive layer 60 is deposited on the first conductive layer 50. The first conductive layer 50 can be polysilicon or another conductive material, and the second conductive material 60 can be tungsten, tungsten silicide or other suitable materials. The first and second conductive layers 50 and 60 are patterned using a second photolithographic process to form raised bit lines. For example, FIGS. 5A and 5B illustrate the memory cell 10 after performing the second photolithographic process and etching the first and second conductive layers 50 and 60 to form a plurality of raised bit lines 65. The bit lines 65 are raised relative to the top surface of the bit line contacts 32 because the first conductive layer 50 covers the upper surface of the bit line contacts 32. After forming the bit lines 65, the conventional techniques proceed with protecting the bit lines 65 and forming contacts to the cell plugs 34.

FIGS. 6A-8B illustrate subsequent stages of the conventional techniques in which contacts to the cell plugs 34 are constructed after forming the raised bit lines 65. Referring to FIGS. 6A and 6B, a second dielectric layer 70 is deposited over the memory cell 10 to protect the bit lines 65. Referring to FIGS. 7A and 7B, the dielectric layer 70 is patterned using a third photolithographic process and then etched to form contact holes 72 in the dielectric layer 70. The contact holes 72 are formed only over the cell plugs 34. The contact holes 72 are accordingly formed in a separate photolithographic procedure in addition to the photolithographic procedures for forming the bit line contacts 32 and the bit lines 65. After forming the contact holes 72, a layer of conductive material is deposited over the memory cell 10 to fill the contact holes 72. FIGS. 8A and 8B illustrate the memory cell 10 after a conductive layer 80 has been deposited to fill the contact holes 72 and then planarized to form individual contacts 82 that are electrically coupled with the cell plugs 34.

One concern regarding conventional techniques is that a large number of photolithographic procedures are necessary to form bit lines, contacts and cell plugs. For example, to form the structure shown in FIGS. 5A and 5B from the structure shown in FIGS. 4A and 4B, a layer of resist is deposited over the second conductive layers 60, the resist layer is then patterned using costly stepper tools, and then the first and second conductive layers 50 and 60 are etched to form the bit lines 65. The formation of the contacts 82 shown in FIG. 8B requires a separate, additional photolithographic procedure. For example, to form the structure shown in FIGS. 7A and 7B from the structure shown in FIGS. 6A and 6B, another layer of resist is deposited onto the dielectric layer 70, the dielectric layer 70 is then patterned using photolithographic techniques, and the contact holes 72 are then etched through the dielectric layer. The additional photolithographic process for forming the contacts 82 increases the cost of manufacturing the memory cell 10 because of the equipment, time and materials that are necessary for the additional photolithographic procedures.

Another concern regarding conventional processing techniques is that photolithographic procedures can induce errors and be a limiting factor in manufacturing small components in high densities. It will be appreciated that the tolerances significantly decrease for forming small, high-density components because the spacing between the components significantly decreases. As a result, the photolithographic procedures must be more precise to properly align the bit lines 65 with the bit line contacts 32 and the contacts 82 with the cell plugs 34. Moreover, the bit lines 65 and the contacts 82 cannot be electrically or capacitively coupled with each other. Therefore, as the size of components decreases and the density increases, errors induced by photolithographic procedures are much more likely to cause shorting or capacitive coupling.

SUMMARY

The present invention is directed toward methods of fabricating components for microelectronic devices, microelectronic devices including memory cells or other components, and computers including memory devices. For example, one embodiment is directed toward a method of fabricating a memory cell on a workpiece having a substrate, a plurality of active areas in the substrate, and a dielectric layer over the active areas. One embodiment of the method includes constructing bit line contact openings in the dielectric layer over first portions of the active areas and cell plug openings over second portions of the active areas. The method also includes depositing a first conductive material into the bit line contact openings to form bit line contacts and into the cell plug openings to form cell plugs. This embodiment continues by forming a trench through an upper portion of a plurality of the bit line contacts and portions of the dielectric layer between bit line contacts. The trench has a first sidewall and a second sidewall. In certain embodiments, the method continues by fabricating a spacer made from a dielectric material along at least the first sidewall of the trench and then fabricating a bit line in the trench. The bit line is embedded into the bit line contacts. The bit line is electrically coupled to selected bit line contacts, but is electrically insulated from the cell plugs.

Another embodiment of a method of fabricating a memory cell on a workpiece includes constructing bit line contact openings over first portions of the active areas and cell plug openings over second portions of the active areas. A first conductive material is then deposited into the bit line contact openings to form bit line contacts and into the cell plug openings to form cell plugs. After depositing the first conductive material, a trench is formed through an upper portion of a plurality of bit line contacts and the dielectric layer. A bit line is then fabricated in the trench. For example, the bit lines can be fabricated by filling the trench with a conductive material and then planarizing the workpiece so that the bit line is below an upper surface of the bit line contacts. The bit line is electrically coupled to selected bit line contacts, but is electrically insulated from the cell plugs in this embodiment.

Another method for fabricating a component on a microelectronic device includes forming a first pattern on the dielectric layer having an arrangement of bit line contact openings over first portions of the active areas and having an arrangement of cell plug openings over second portions of the active areas. The method continues by etching the dielectric layer to form bit line contact openings over the first portions of the active areas and cell plug openings over the second portions of the active areas. After etching the bit line openings and the cell plug openings, the method continues by depositing a first conductive material into the bit line openings to construct bit line contacts and into the cell plug openings to construct cell plugs. The method also includes forming another pattern on the workpiece having an elongated slot extending over a plurality of the bit line contacts and portions of the dielectric layer. In one particular embodiment, the elongated slot is superimposed over a shallow trench isolation structure but not over the first and second portions of the active areas. After forming the elongated slot, an elongated trench is etched in an upper portion of the bit line contacts and the dielectric layer. The elongated trench is subsequently filled with a second conductive material. The process continues by planarizing the workpiece in a single planarizing process that forms a bit line in the elongated trench, bit line contacts in the dielectric layer, and cell plugs in the dielectric layer.

Still another embodiment is directed toward a method of fabricating a component for a microelectronic device having a workpiece including a substrate, a plurality of active areas in the substrate, a dielectric layer over the active areas, bit line contacts in the dielectric layer contacting a first portion of the active areas, and cell plugs in the dielectric layer contacting a second portion of the active areas. This embodiment includes embedding an elongated bit line in a trench extending through an upper portion of the bit line contacts and sections of the dielectric layer between the bit line contacts. The bit line can be offset from the active areas contacted by the bit line contacts. This embodiment also includes electrically insulating the bit line from the cell plugs by providing a dielectric spacer in the trench between the bit line and the cell plugs.

Another aspect of the invention is directed toward microelectronic devices. In one embodiment, a microelectronic device includes a workpiece including a substrate, a plurality of active areas in the substrate, and a dielectric layer over the active areas. The substrate also includes a plurality of bit line contacts in the dielectric layer contacting first portions of the active areas and a plurality of cell plugs in the dielectric layer contacting second portions of the active areas. The microelectronic device further includes a bit line structure embedded in an upper portion of the bit line contacts and portions of the dielectric layer between the bit line contacts. The bit line structure comprises an elongated conductive line and a dielectric spacer between the conductive line and the cell plugs adjacent to the conductive line.

Another embodiment of a microelectronic device in accordance with the invention comprises a workpiece including a substrate, a plurality of active areas in the substrate, and a dielectric layer over the active areas. The dielectric layer has an upper surface. The microelectronic device also includes a plurality of bit line contacts in the dielectric layer contacting first portions of the active areas and a plurality of cell plugs in the dielectric layer contacting second portions of the active areas. The microelectronic device further includes a conductive, elongated bit line embedded in an upper portion of the bit line contacts and portions of the dielectric layer between the bit line contacts. The bit line extends between cell plugs, and a dielectric spacer separate from the dielectric layer can extend between the conductive line and the cell plugs adjacent to the conductive line.

BRIEF DESCRIPTION OF THE DRAWINGS

FIGS. 2A and 2B illustrate a stage of forming bit lines and contacts for memory cells in accordance with conventional procedures of the prior art.

FIGS. 3A and 3B illustrate a subsequent stage of forming bit lines and contacts for memory cells in accordance with the prior art.

FIGS. 4A and 4B illustrate a subsequent stage of forming bit lines and contacts for memory cells in accordance with the prior art.

FIGS. 5A and 5B illustrate a subsequent stage of forming bit lines and contacts for memory cells in accordance with the prior art.

FIGS. 6A and 6B illustrate a subsequent stage of forming bit lines and contacts for memory cells in accordance with the prior art.

FIGS. 7A and 7B illustrate a subsequent stage of forming bit lines and contacts for memory cells in accordance with the prior art.

FIGS. 8A and 8B illustrate a subsequent stage of forming bit lines and contacts for memory cells in accordance with the prior art.

DETAILED DESCRIPTION

The present invention is directed toward methods for fabricating memory cells and other microelectronic components, methods for manufacturing microelectronic devices, and microelectronic devices. The term "microelectronic device" is used throughout to include devices that have integrated circuits, such as processors, memory devices, amplifiers, field emission displays, and many other types of devices. Several embodiments of the present invention are described with respect to memory devices, but the methods and structures are also applicable to processors, amplifiers and other types of microelectronic devices. Several embodiments of the invention are shown in FIGS. 9A-19. One skilled in the art will understand that the present invention may have other embodiments in addition to those disclosed below and that such other embodiments of the invention may be practiced with additional features or without several elements of the embodiments shown in FIGS. 9A-19.

A. Embodiments of Processes for Fabricating Microelectronic Components

Figure 1:
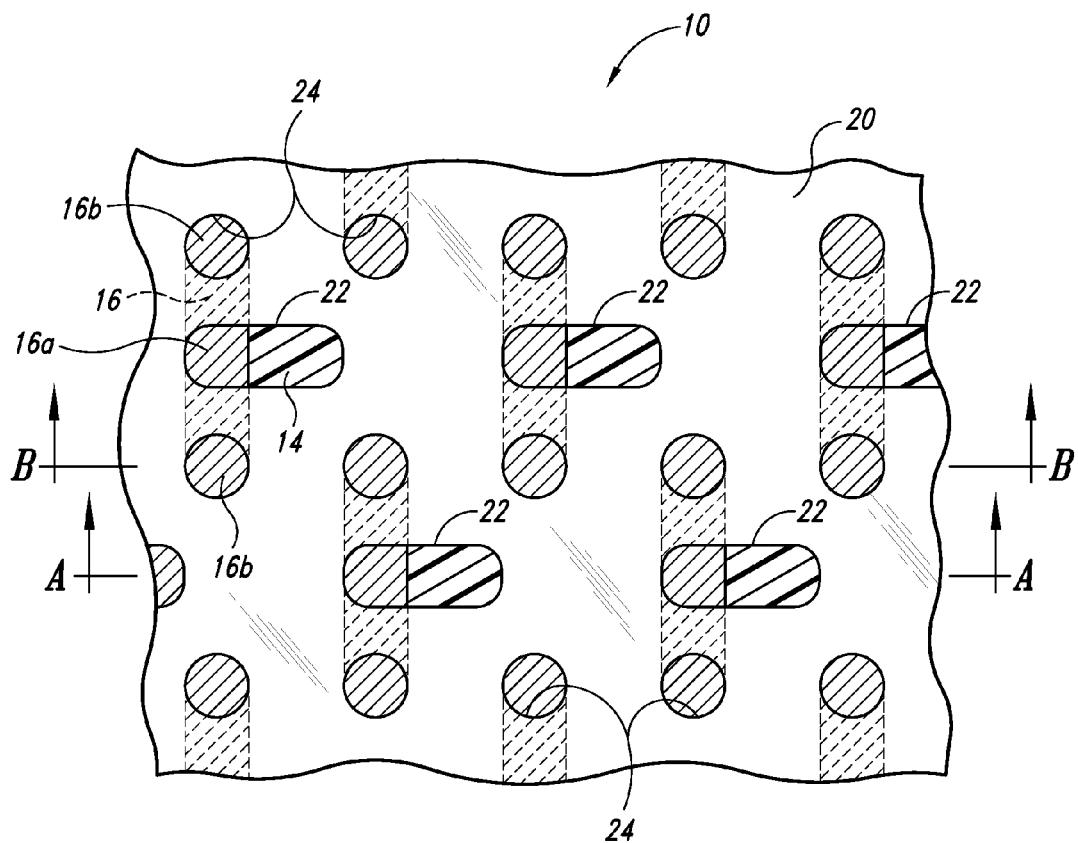
FIG. 1 is a schematic top plan view of a portion of a memory cell in accordance with the prior art.
Figure 2A:
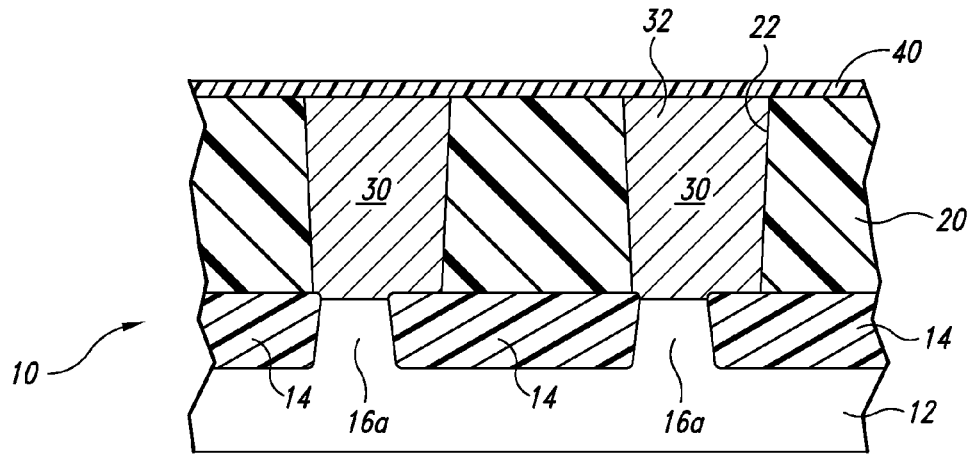
FIG. 2A is a schematic cross-sectional view taken along line A-A of FIG. 1.
Figure 2B:
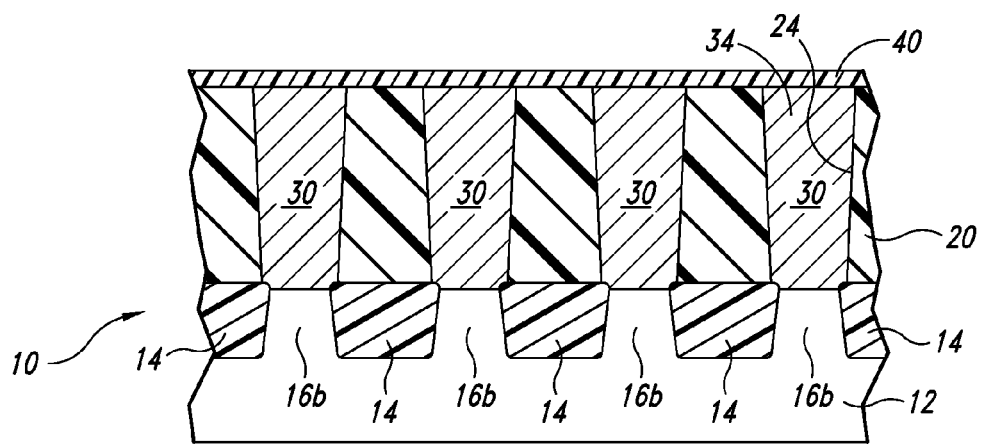
FIG. 2B is a schematic cross-sectional view taken along line B-B of FIG. 1.
Figure 3A:
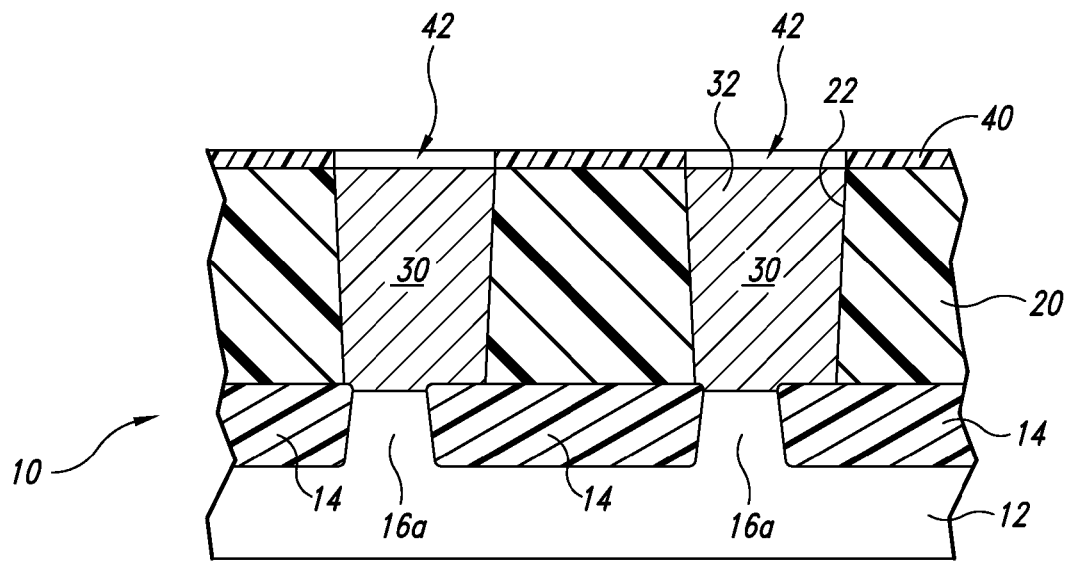
FIG. 3A is a schematic cross-sectional view taken along line A-A of FIG. 1.
Figure 3B:
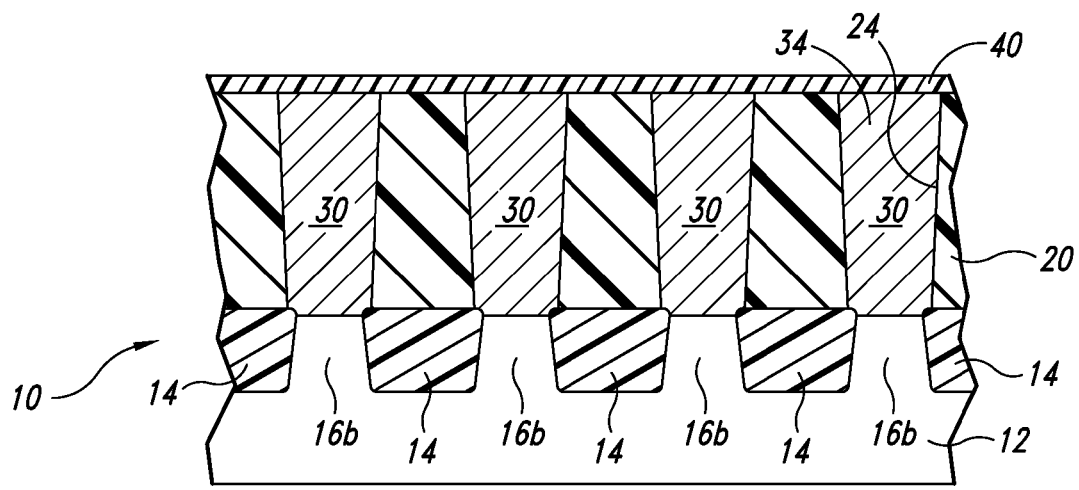
FIG. 3B is a schematic cross-sectional view taken along line B-B of FIG. 1.
Figure 4A:
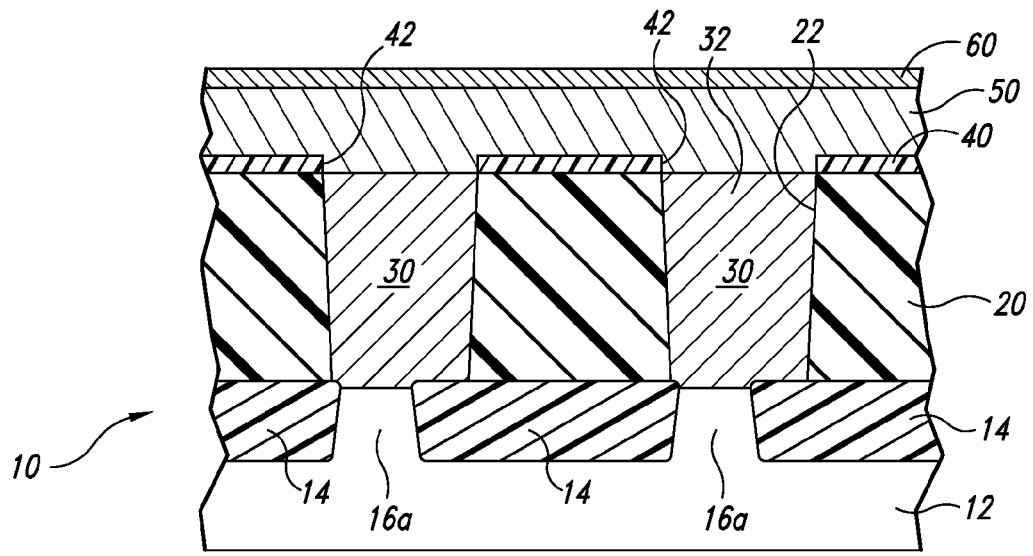
FIG. 4A is a schematic cross-sectional view taken along line A-A of FIG. 1.
Figure 4B:
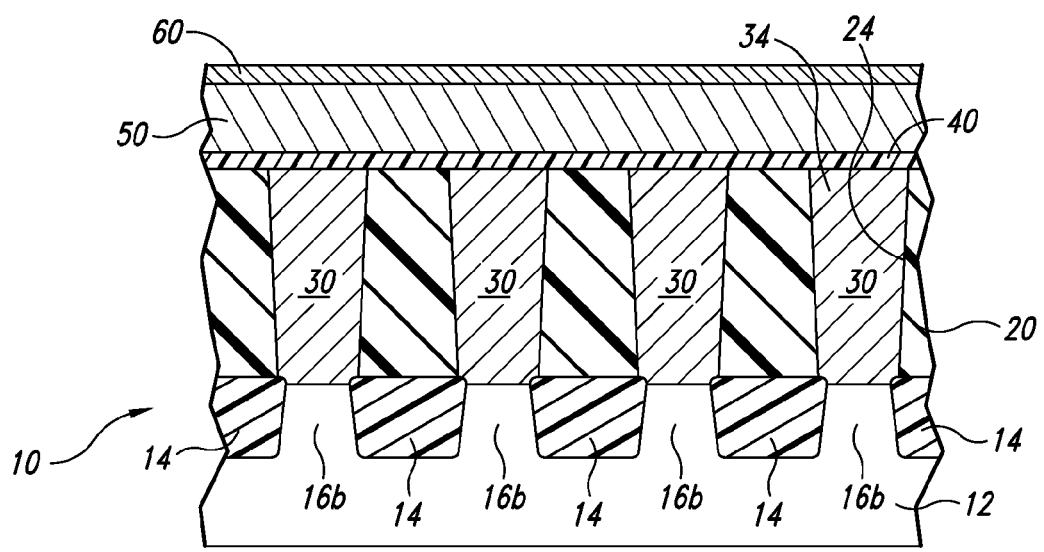
FIG. 4B is a schematic cross-sectional view taken along line B-B of FIG. 1.
Figure 5A:
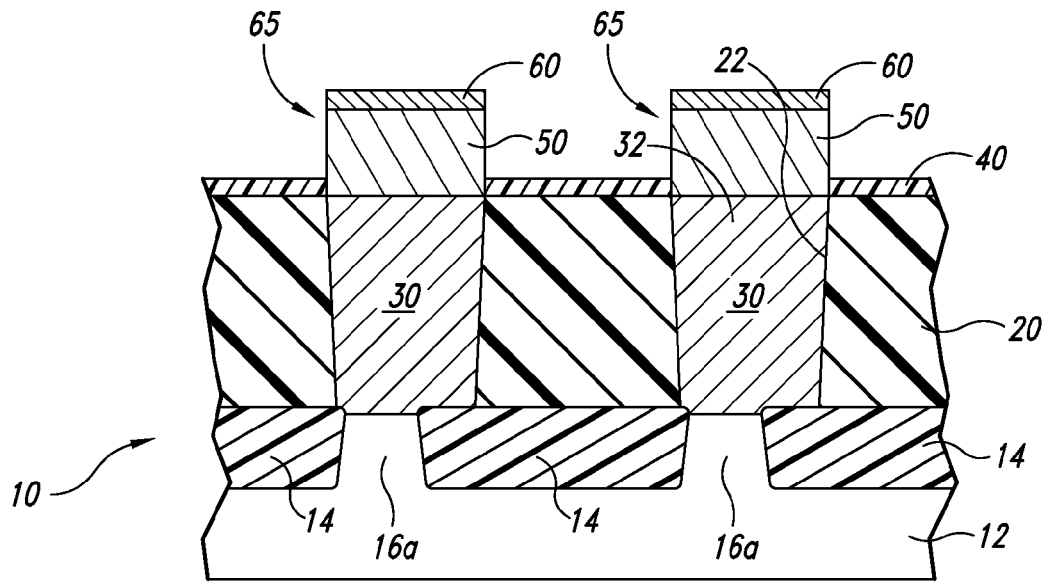
FIG. 5A is a schematic cross-sectional view taken along line A-A of FIG. 1.
Figure 5B:
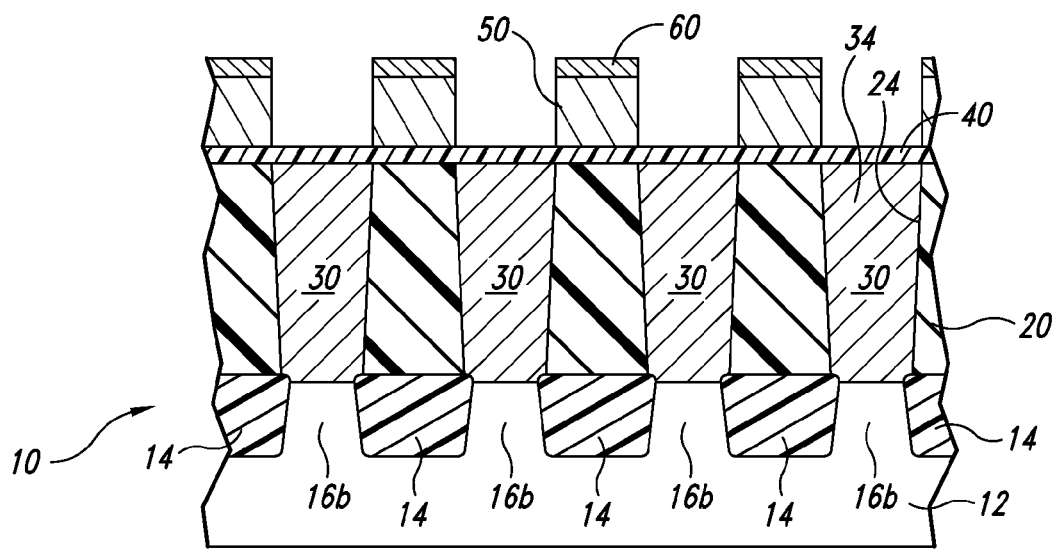
FIG. 5B is a schematic cross-sectional view taken along line B-B of FIG. 1.
Figure 6A:
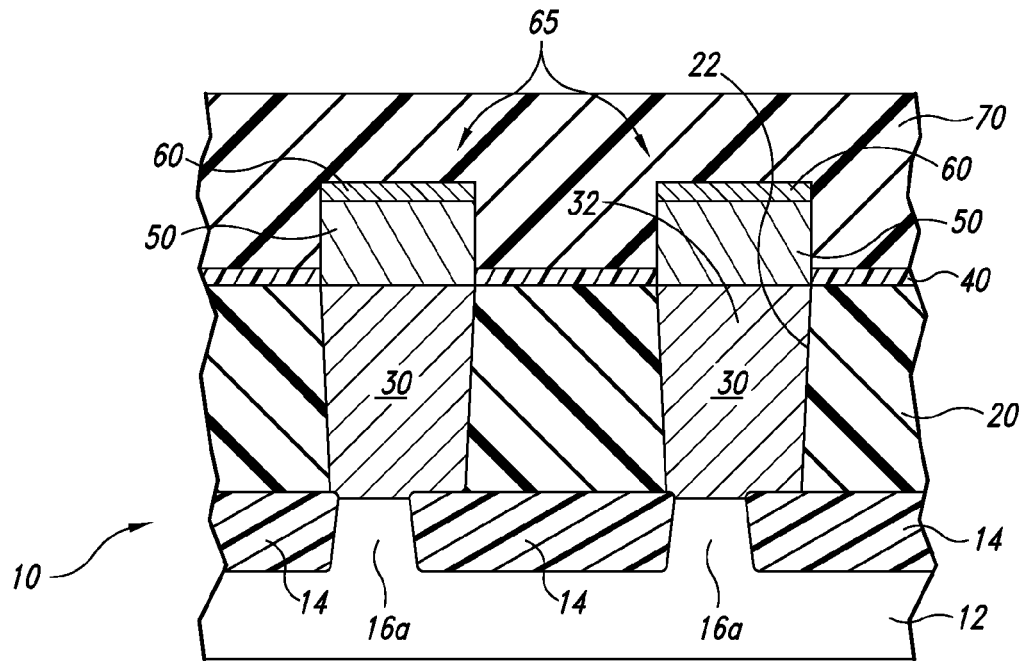
FIG. 6A is a schematic cross-sectional view taken along line A-A of FIG. 1.
Figure 6B:
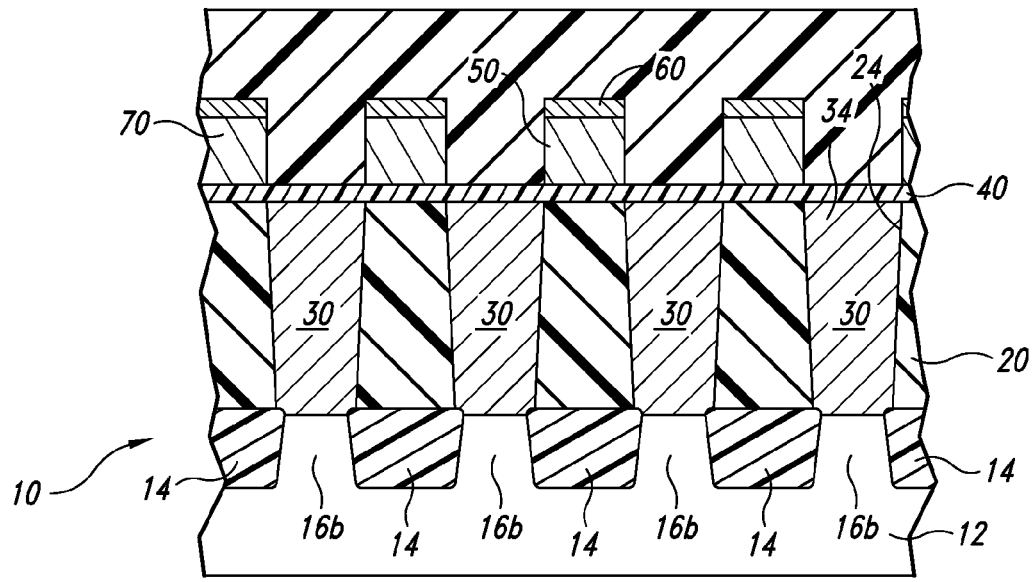
FIG. 6B is a schematic cross-sectional view taken along line B-B of FIG. 1.
Figure 7A:
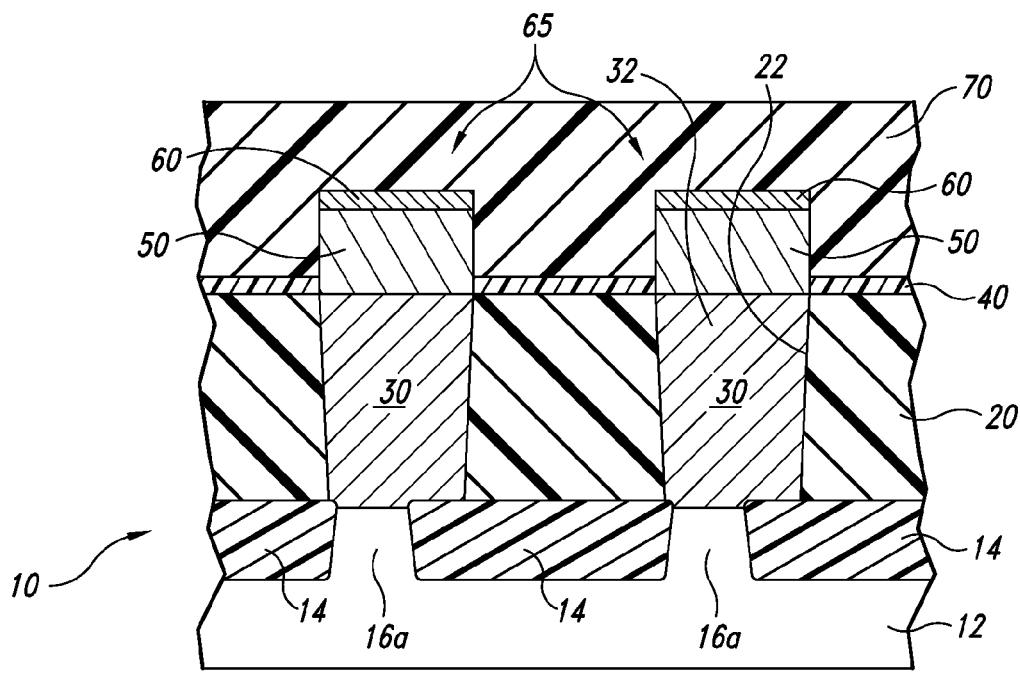
FIG. 7A is a schematic cross-sectional view taken along line A-A of FIG. 1.
Figure 7B:
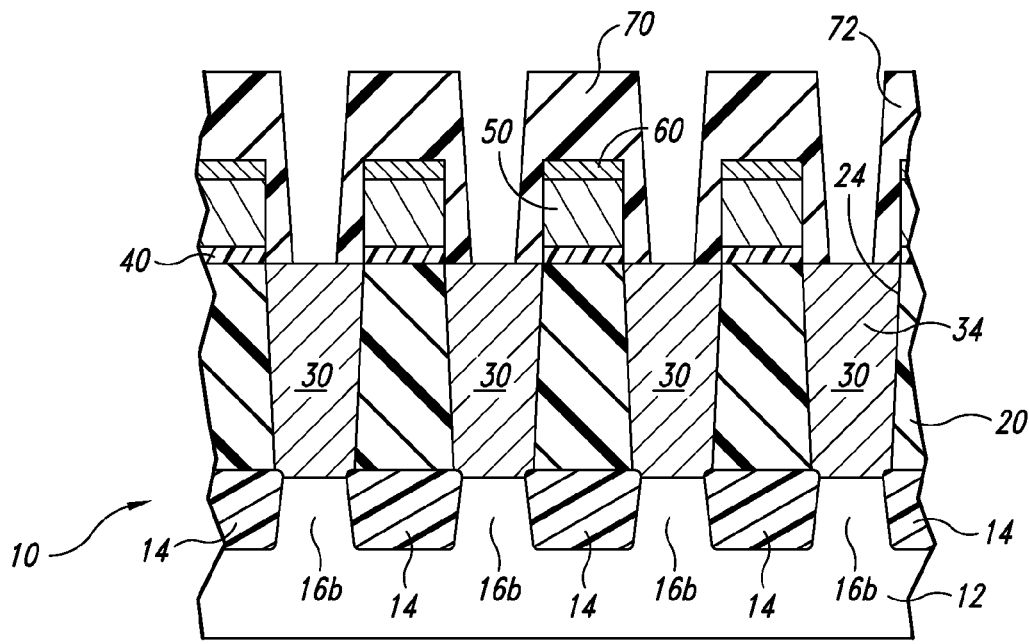
FIG. 7B is a schematic cross-sectional view taken along line B-B of FIG. 1.
Figure 8A:
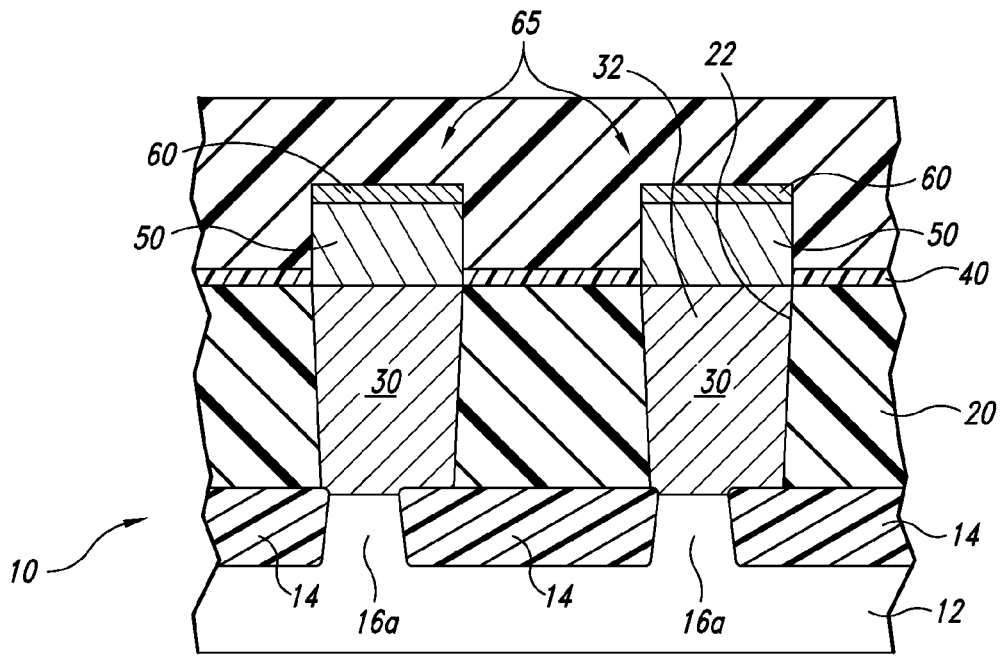
FIG. 8A is a schematic cross-sectional view taken along line A-A of FIG. 1.
Figure 8B:
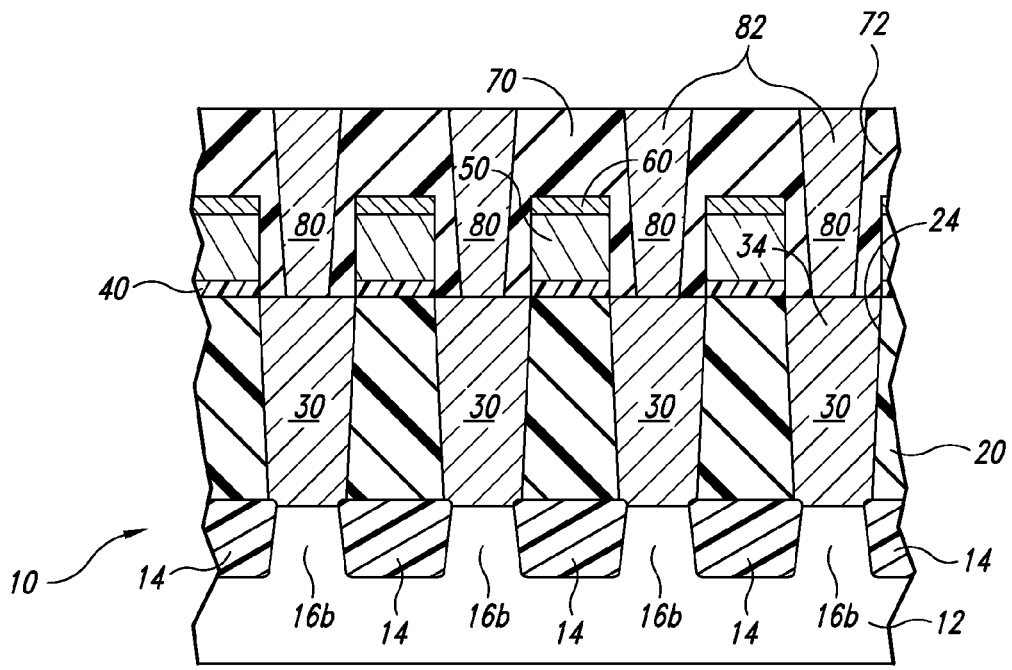
FIG. 8B is a schematic cross-sectional view taken along line B-B of FIG. 1.
Figure 9A:
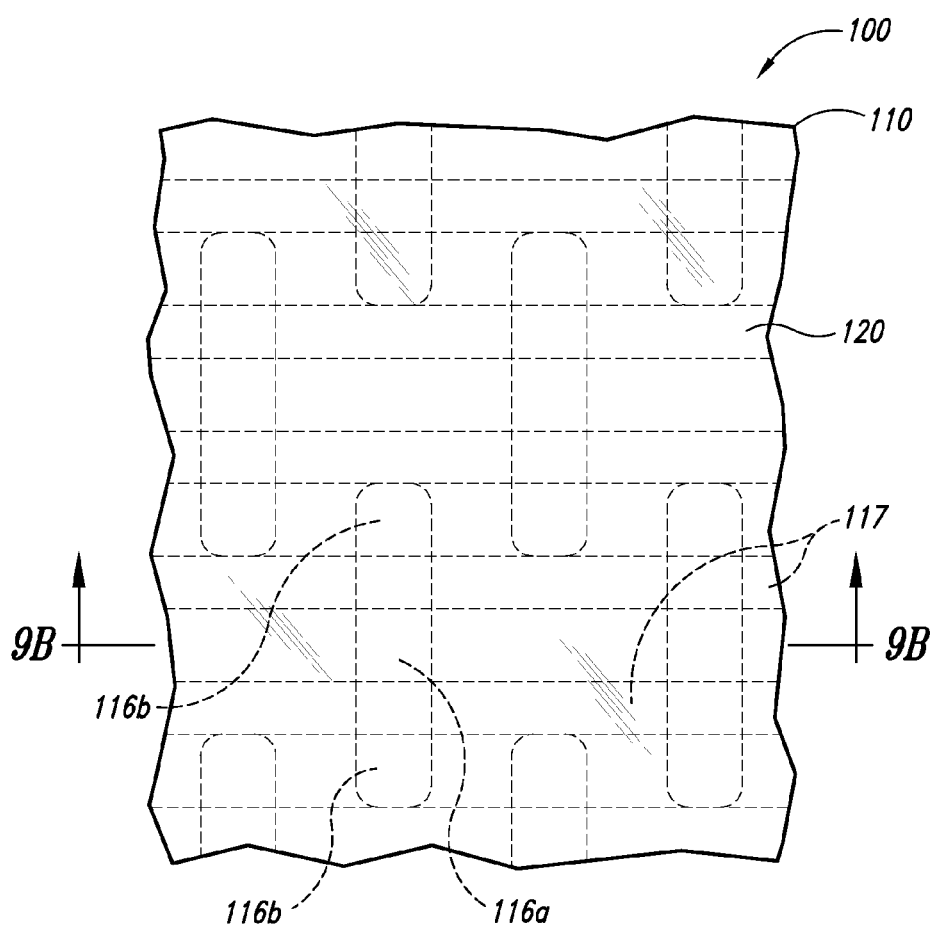
FIG. 9A is a schematic top plan view of a microelectronic device workpiece at one stage of a method for forming bit lines and contacts in a memory cell in accordance with an embodiment of the invention.
Figure 9B:
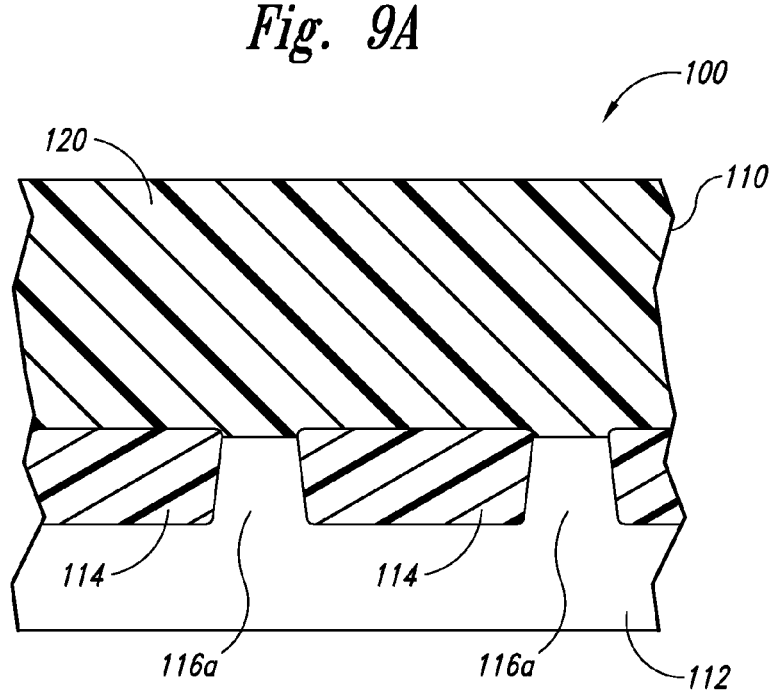
FIG. 9B is a schematic cross-sectional view of the microelectronic device of FIG. 9A taken along line 9-9.

FIG. 9A is a top plan view of a layout of a workpiece 100 showing a portion of a memory cell 110, and FIG. 9B is a schematic cross-sectional view of the workpiece taken along line 9-9. The memory cell 110 includes a substrate 112 (FIG. 9B), a plurality of shallow trench isolation (STI) structures 114 in the substrate 112, and a plurality of active areas 116 (individually identified by reference numbers 116a and 116b). The substrate 112 can be a semiconductor substrate composed of silicon, gallium arsenide or other semiconductor materials. The substrate 112 can alternatively be glass or other materials in other applications. The STI structures 114 are shallow dielectric regions that electrically isolate the active areas 116. The active areas 116 include a first portion 116a defining a bit line active area and one or more second portions 116b defining cell active areas. The active areas 116 can be doped or implanted with other materials to form source regions, drain regions and other structures. The memory cell 110 also includes a plurality of FET lines 117 (FIG. 9A) on the substrate 112. The FET lines 117 are typically electrically conductive lines that are on or in the substrate 112. The memory cell 110 can further include a dielectric layer 120 comprising borophosphate silicon glass (BPSG) or other suitable dielectric materials. The dielectric layer 120 can define a base dielectric layer deposited directly onto the substrate 112.

Figure 10A:
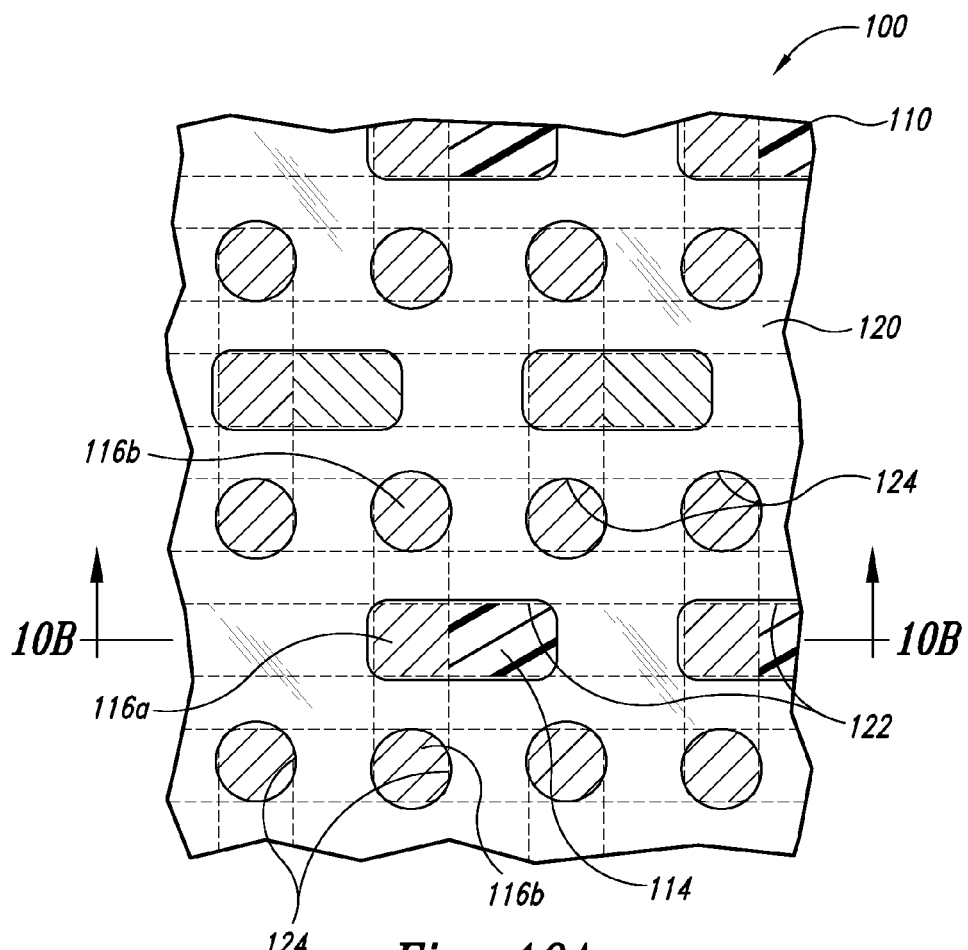
FIG. 10A is a schematic top plan view of the microelectronic device workpiece at a subsequent stage of the method for forming bit lines and contacts in a memory cell in accordance with an embodiment of the invention.
Figure 10B:
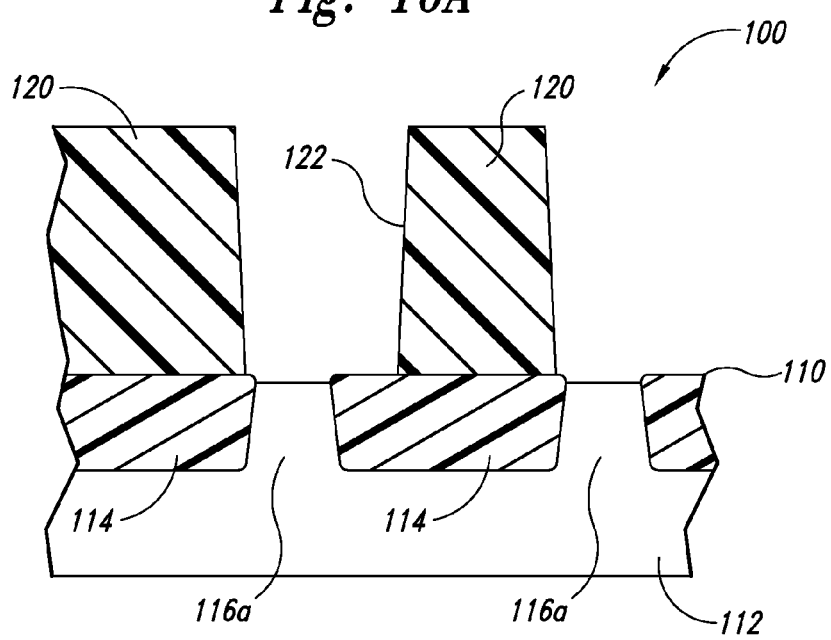
FIG. 10B is a schematic cross-sectional view of the microelectronic device workpiece of FIG. 10A taken along line 10-10.

FIGS. 10A and 10B illustrate the workpiece 100 at a subsequent stage of the method for fabricating microelectronic components. FIG. 10A is a top plan view of the workpiece 100, and FIG. 10B is a cross-sectional view taken along line 10-10. At this stage of the method, a plurality of bit line contact openings 122 and cell plug openings 124 are formed in the dielectric layer 120 to expose discrete portions of the first and second active areas 116a and 116b. More specifically, in the embodiment of the memory cell 110, the bit line contact openings 122 expose the first active areas 116a and a portion of the adjacent STI structure 114. The cell plug openings 124 expose the second active areas 116b. The bit line contact openings 122 and the cell plug openings 214 can be formed using a first photolithographic process followed by an etching procedure. For example, the dielectric layer 120 shown in FIG. 9B can be covered with a layer of resist, which is then patterned using the first photolithographic procedure to form apertures in the resist layer corresponding to the pattern of bit line contact openings 122 and cell plug openings 124. The portions of the dielectric layer 120 exposed through the apertures in the resist layer can then be etched using an anisotropic etching process that forms substantially straight sidewalls in the dielectric layer 120. The layer of resist can then be removed from the workpiece 100 to leave the structure shown in FIGS. 10A and 10B.

Figure 11A:
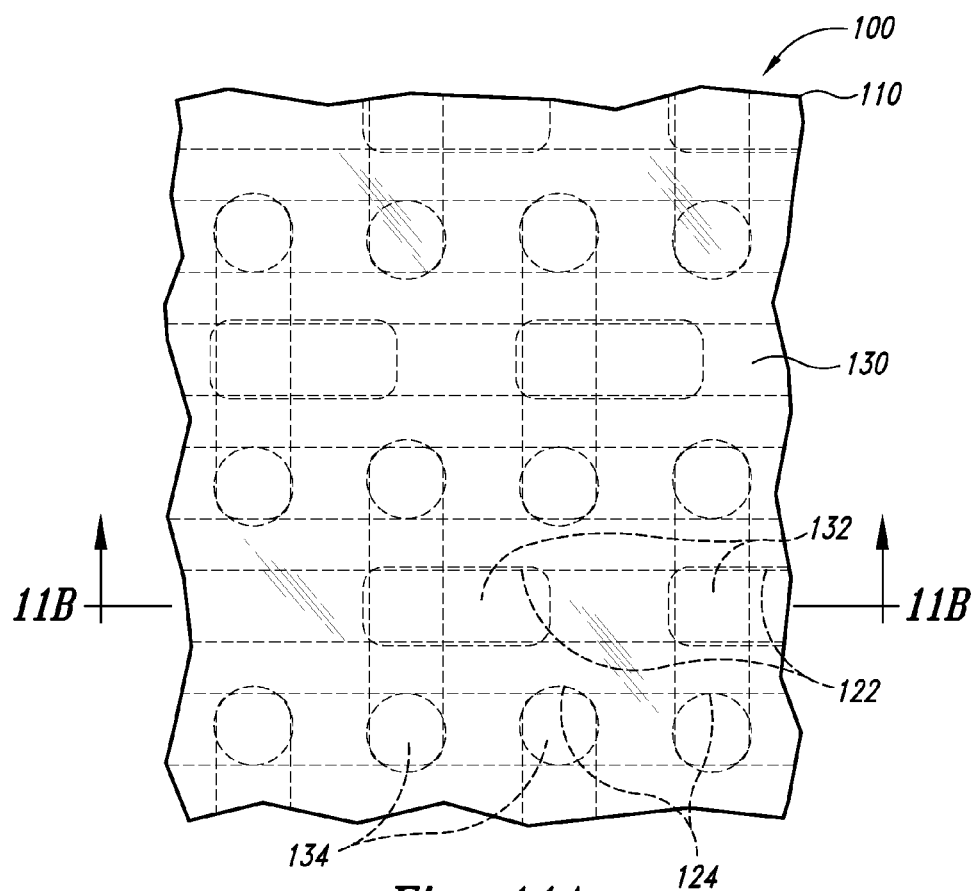
FIG. 11A is a schematic top plan view of the microelectronic device workpiece at a subsequent stage of the method for forming bit lines and contacts in a memory cell in accordance with an embodiment of the invention.
Figure 11B:
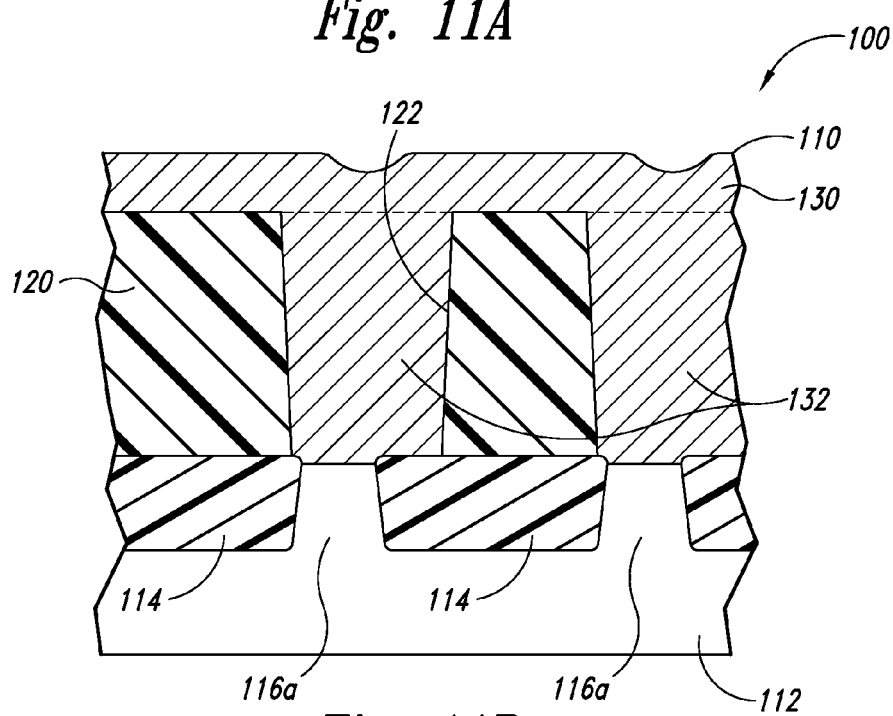
FIG. 11B is a schematic cross-sectional view of the microelectronic device workpiece of FIG. 11A taken along line 11-11.

FIG. 11A is a top plan view of the workpiece 100 at a subsequent stage of forming microelectronic components, and FIG. 11B is a cross-sectional view taken along line 11-11. At this stage of the method, a first conductive material 130 is deposited into the bit line contact openings 122 and the cell plug openings 124. The first conductive material 130 can be a polysilicon layer or another suitable electrically conductive material for forming (a) bit line contacts in the bit line contact openings 122 and (b) cell plugs in the cell plug openings 124. The portion of the first conductive material 130 in the bit line contact openings 122 accordingly defines bit line contacts 132, and the portion of the first conductive material 130 in the cell plug openings 124 accordingly defines cell plugs 134 (FIG. 11B). Referring to FIGS. 10A-11B, the basic structure of the bit line contacts 132 and the cell plugs 134 is constructed using a single combination of photolithographic/etch/deposition procedures. This single combination of procedures provides the material for both the bit line contacts and the cell plugs; subsequent procedures in accordance with several embodiments of the invention use this structure to construct bit lines without several steps and layers used in conventional techniques.

Figure 12A:
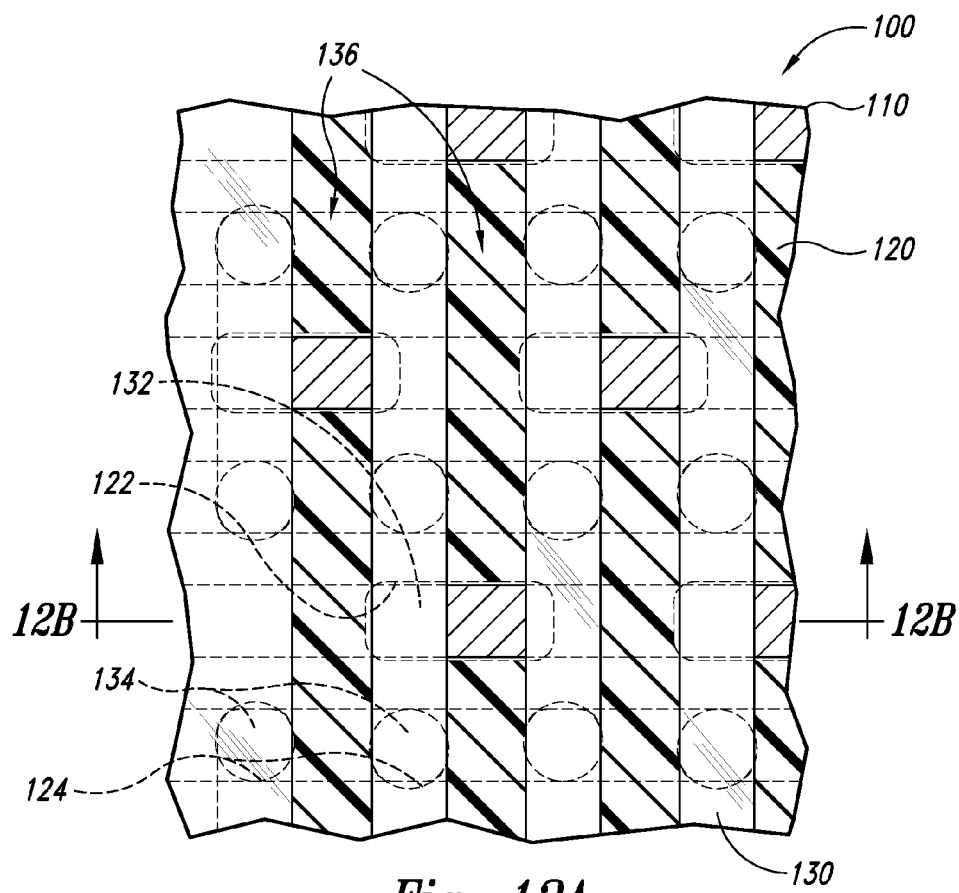
FIG. 12A is a schematic top plan view of the microelectronic device workpiece at a subsequent stage of the method for forming bit lines and contacts in a memory cell in accordance with an embodiment of the invention.
Figure 12B:
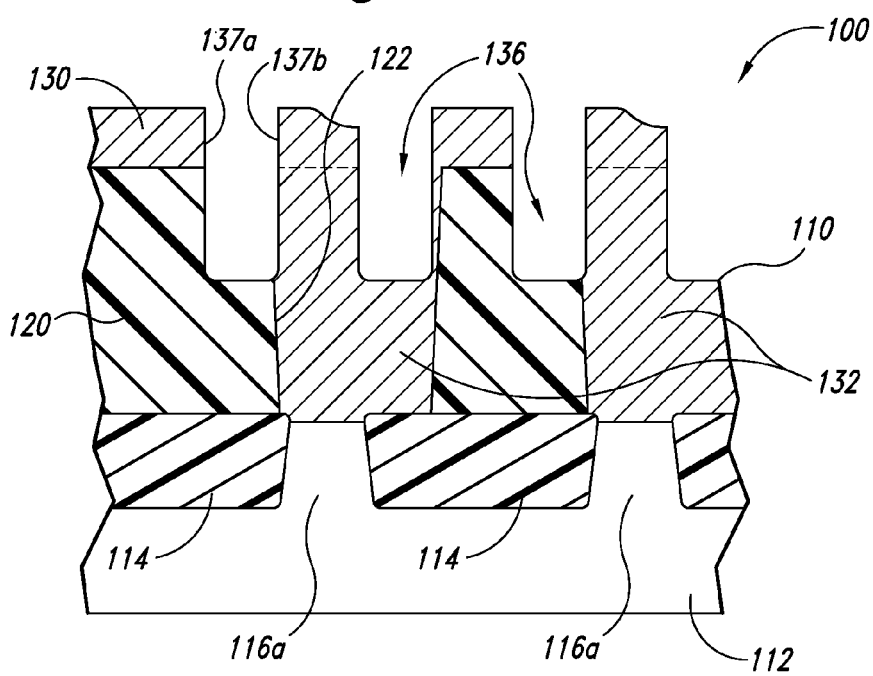
FIG. 12B is a schematic cross-sectional view of the microelectronic device workpiece of FIG. 12A taken along line 12-12.

FIG. 12A is a top plan view of the workpiece 100 at a subsequent stage of the method for forming microelectronic components, and FIG. 12B is a cross-sectional view taken along line 12-12. At this stage, a second pattern (not shown) is formed over the top surface of the first conductive material 130 shown in FIG. 11B. The second pattern is formed by depositing a resist layer (not shown) over the first conductive layer 130 shown in FIG. 11B and then using a second photolithographic procedure to form an arrangement of elongated slots in the layer of resist. The elongated slots are positioned over the bit line contacts 132 and the portions of the dielectric layer 120 between the bit line contacts (see FIG. 12A). The elongated slots are preferably superimposed over portions of the STI structures 114 that are adjacent to the first active areas 116a, but the elongated slots are not positioned over the first active areas 116a coupled to the bit line contacts 132.

After performing the second photolithographic process, a plurality of elongated trenches 136 are then etched in the workpiece 100. The trenches 136 extend through the upper sections of the bit line contacts 132 and the portions of the dielectric layer 120 between the bit line contacts 132. In the particular embodiment shown in FIGS. 12A and 12B, the trenches 136 are superimposed over portions of the STI structures 114 between the first active areas 116a but not over the first active areas 116a for the bit line contacts 132. The trenches 136 shown in the embodiment of FIGS. 12A and 12B also extend between the cell plugs 134. As the dimensions of the cell plugs 134 decrease and the density of components of the memory cell 110 increase, the trenches 136 can have sidewalls 137a and 137b that pass directly adjacent to the cell plugs 134 (FIG. 12A). As explained in more detail below, the second photolithographic process for forming the trenches 136 can be the final photolithographic process for forming the bit line contacts 132, the cell plugs 134, and bit lines for the memory cell 110.

Figure 13A:
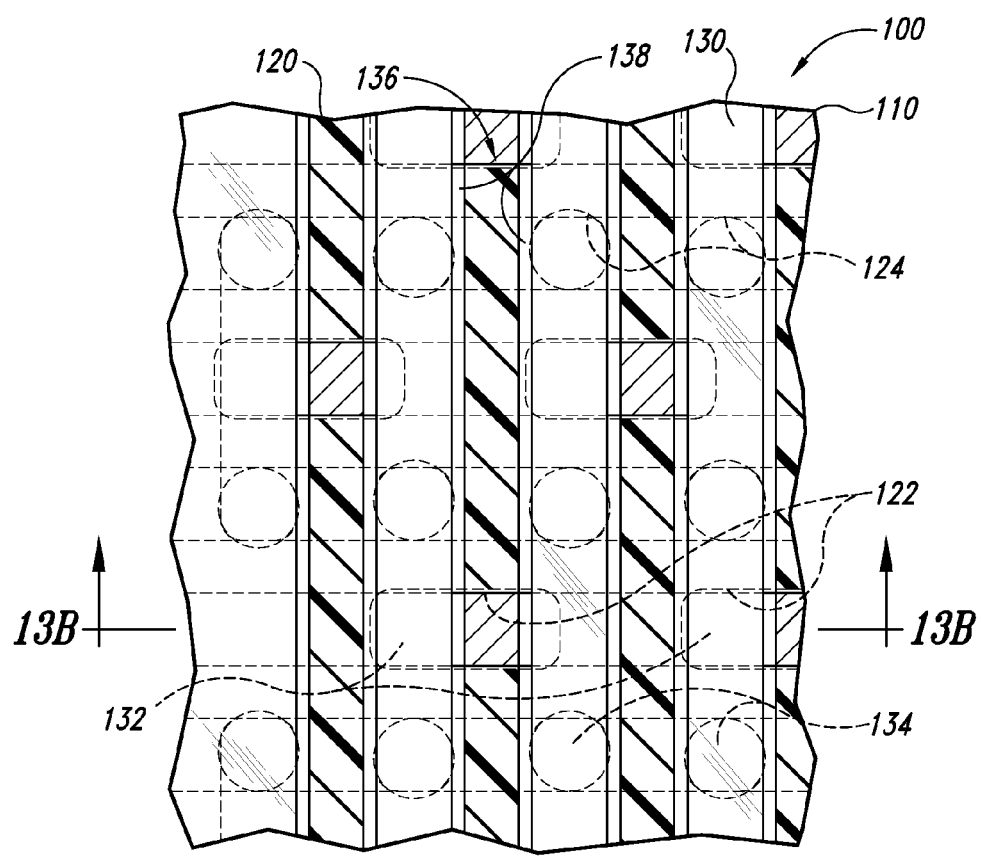
FIG. 13A is a schematic top plan view of the microelectronic device workpiece at a subsequent stage of the method for forming bit lines and contacts in a memory cell in accordance with an embodiment of the invention.
Figure 13B:
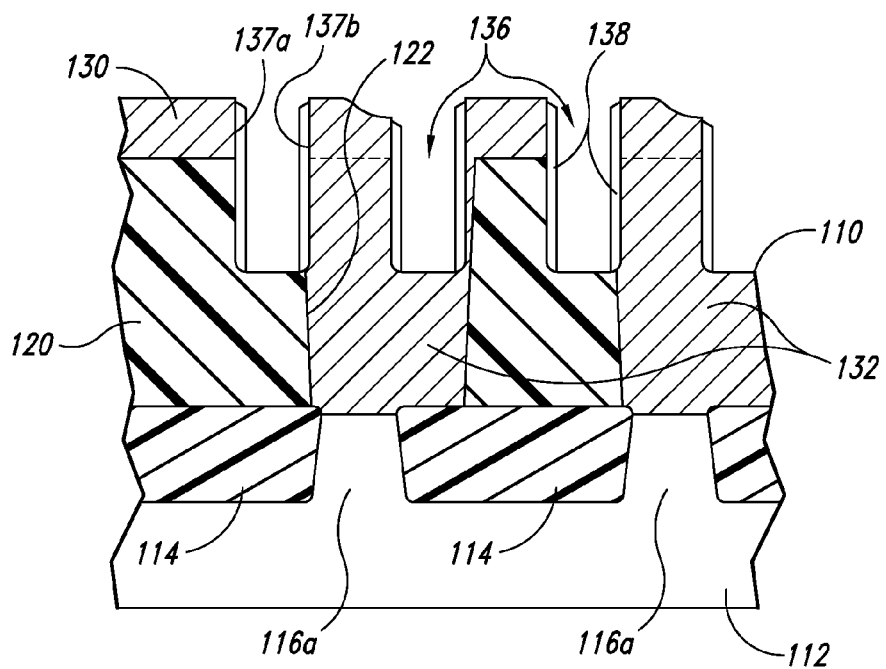
FIG. 13B is a schematic cross-sectional view of the microelectronic device workpiece of FIG. 13A taken along line 13-13.

FIG. 13A is a top plan view and FIG. 13B is a cross-sectional view taken along line 13-13. At this stage of the method, dielectric spacers 138 are formed along the first and second sidewalls 137a and 137b of the trenches 136. The spacers 13b are formed by depositing an oxide or nitride layer over the first conductive layer 130 and the exposed portions of the dielectric layer 120 in the trenches 136. The conformal layer of spacer material is then dry etched without the need for a pattern. The dry etching removes the spacer material from the top of the first conductive material 130 and in the bottom of the trenches 136. The dry etch process also removes a portion of the spacer material at the top of the first and second sidewalls 137a and 137b. The upper portions of the first conductive material 130 and the spacers 138, however, are removed in a subsequent CMP process. Therefore, there is no need for forming a pattern over the workpiece 100 to remove the spacer material from the bottom of the trenches 136.

Figure 14A:
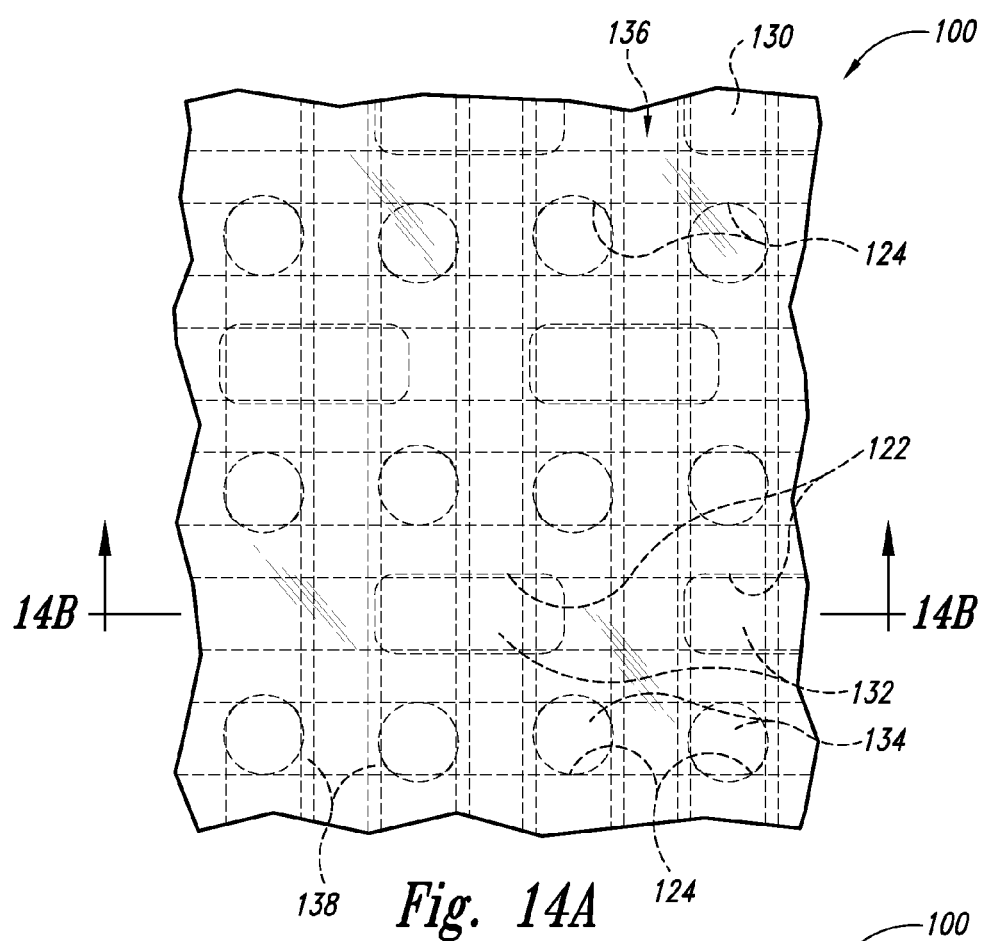
FIG. 14A is a schematic top plan view of the microelectronic device workpiece at a subsequent stage of the method for forming bit lines and contacts in a memory cell in accordance with an embodiment of the invention.
Figure 14B:
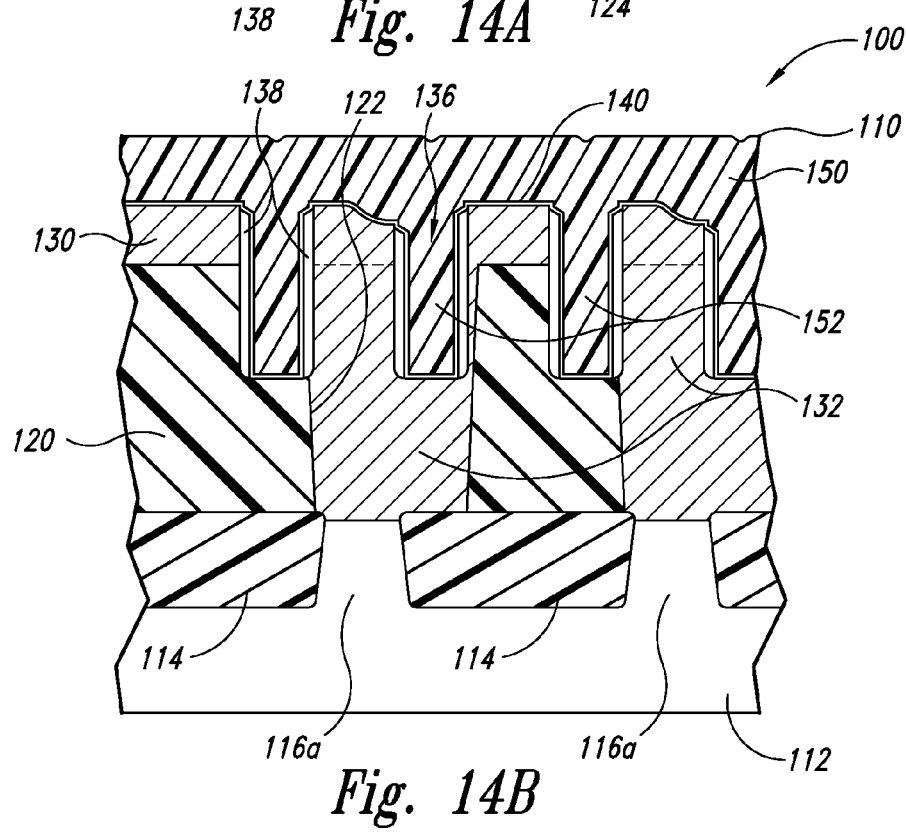
FIG. 14B is a schematic cross-sectional view of the microelectronic device workpiece of FIG. 14A taken along line 14-14.

FIG. 14A is a top plan view of the workpiece 100 at another stage of the method for forming microelectronic components, and FIG. 14B is a cross-sectional view taken along line 14-14. Referring to FIG. 14B, an optional conformal barrier layer 140 is deposited over the workpiece 100 to cover the spacers 138 and the exposed portions of both the dielectric layer 120 and the first conductive material 130 in the trenches 136. A second conductive material 150 is deposited over the barrier layer 140 to fill the trenches 136. The purpose of the barrier layer 140 is to prevent the second conductive material from consuming and/or diffusing into the dielectric layer 120 and/or the first conductive material 130. The composition of the barrier layer 140 accordingly depends on the composition of the second conductive material 150.

In one embodiment, the second conductive material 150 can be tungsten, copper or other suitable highly conductive materials. When the second conductive material is tungsten, the barrier layer 140 is composed of tungsten nitride because tungsten nitride prevents tungsten from consuming polysilicon. When the second conductive material 150 is copper, the barrier layer 140 can be tantalum because tantalum prevents copper from diffusing into either a silicon-based dielectric layer 120 or a polysilicon first conductive layer 130.

Figure 15A:
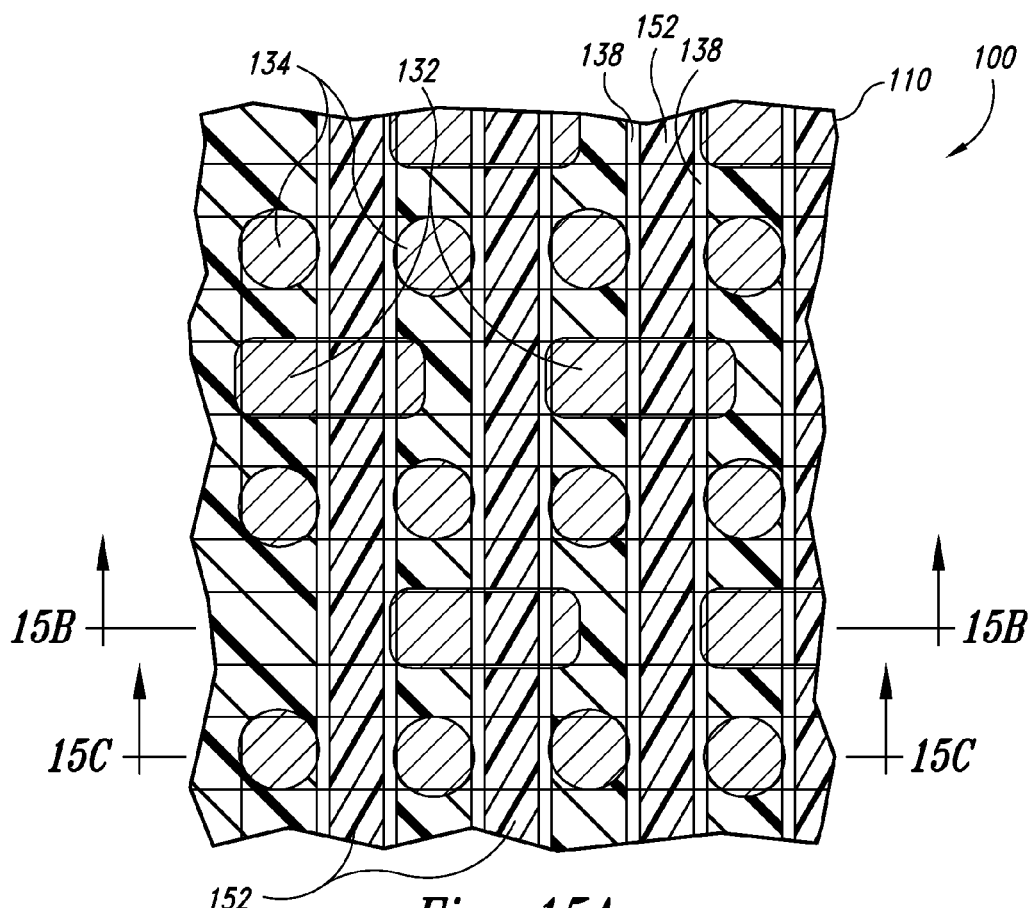
FIG. 15A is a schematic top plan view of the microelectronic device workpiece at a subsequent stage of the method for forming bit lines and contacts in a memory cell in accordance with an embodiment of the invention.
Figure 15B:
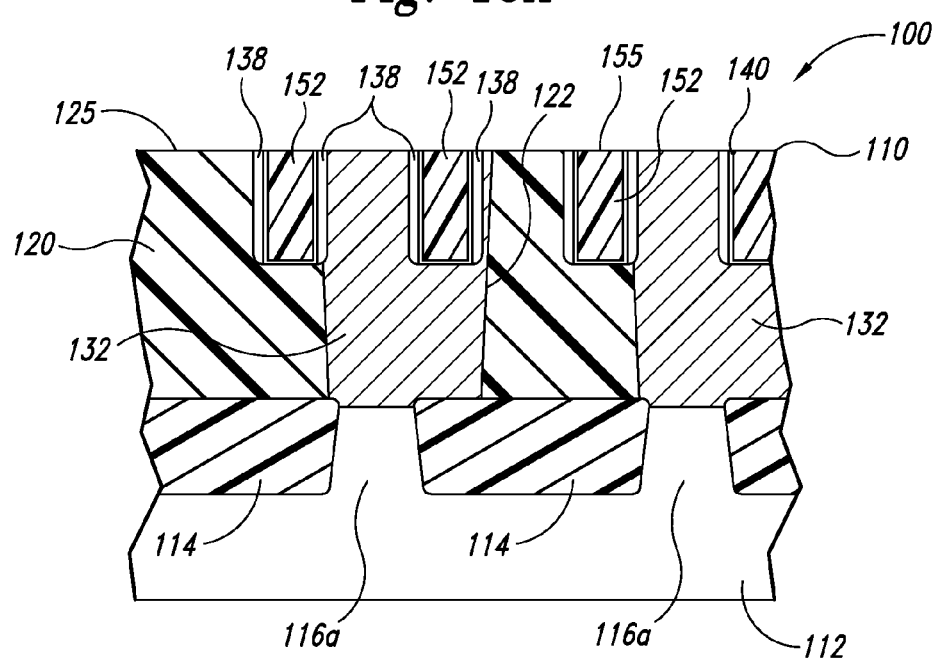
FIG. 15B is a schematic cross-sectional view of the microelectronic device workpiece of FIG. 15A taken along line 15B-15B.
Figure 15C:
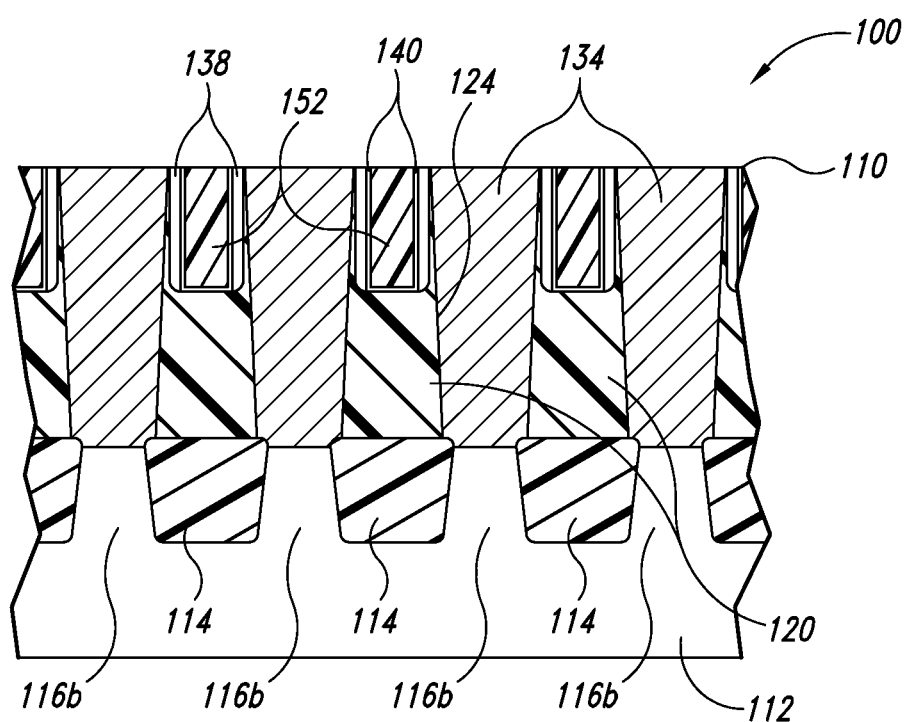
FIG. 15C is a schematic cross-sectional view taken along line 15C-15C.

FIGS. 15A-15C illustrate the workpiece 100 at a subsequent stage of the method for forming microelectronic components. At this stage of the method, the workpiece 100 has been planarized using chemical-mechanical planarization processes or other suitable techniques to remove the overburden portion of the second conductive layer 150 and the first conductive layer 130. The planarizing procedure is preferably endpointed at an elevation coplanar with or slightly below the top surface of the dielectric layer 120. The planarizing procedure accordingly produces bit lines 152 having top surfaces 155 that are coplanar with the exposed top surface 125 of the dielectric layer 120.

FIG. 15B is a cross-sectional view of the workpiece 100 taken along line 15B-15B that illustrates the arrangement of the bit lines 152 and the bit line contacts 132. For example, a bit line 152 is embedded in the upper portion of a bit line contact 132, and the bit line 152 is superimposed over the STI structure 114 between the first active areas 116a for the bit line contact 132. The bit line 152 is not superimposed over the central portion of the first active area 116a for the bit line contact 132. The bit lines 152 are accordingly elongated damascene-type lines.

FIG. 15C is a cross-sectional view of the workpiece 100 taken along 15C-15C that illustrates the arrangement between the bit lines 152 and the cell plugs 134. The bit lines 152 are also positioned over the STI structures 114 between the second active areas 116b for the cell plugs 134. The bit lines 152 accordingly extend between the cell plugs 134. In the embodiment shown in FIG. 15C, the width of the STI structures 114 between the second active areas 116b is very narrow such that the spacers 138 electrically isolate the bit lines 152 from the cell plugs 134. The embedded bit lines 152 with spacers 138 accordingly ensure that the bit lines 152 are electrically isolated from the cell plugs 134 in high-density layouts for memory cells and other types of microelectronic devices. In other embodiments in which the STI structures 114 between the second active areas 116b are wider, the width of the dielectric layer 120 between the cell plugs 134 may be sufficient to electrically isolate an embedded bit line between the cell plugs 134 without having the spacers 138 in the bit line trenches 136.

The embodiments of the method described above with reference to FIGS. 9A-15C are expected to reduce the number of expensive photolithographic processing steps for manufacturing memory cells and other devices. The conventional process for forming bit line contacts, cell plugs, and bit lines described above with reference to FIGS. 1-8B requires a photolithographic process for forming (a) the openings to the dielectric layer for the bit line contacts and the cell plugs, (b) the raised bit lines over the top surface of the bit line contacts, and (c) the openings through an upper dielectric layer for forming contacts to the cell plugs. Several embodiments of the inventive process described above with reference to FIGS. 9A-15C, however, require a photolithographic process only for (a) forming the bit line contact openings 122 and the cell plug openings 124 in the base dielectric layer 120 and (b) forming the elongated bit line trenches 136. The conductive material for both the bit line contacts 132 and the cell plugs 134 is provided by the single deposition process for forming the first conductive layer 130. Therefore, several embodiments of the method for forming damascene-type bit line structures reduce the number of photolithographic procedures that are necessary to form bit line contacts, cell plugs, and bit lines.

Several embodiments of the methods described above with respect to FIGS. 9A-15C are also expected to enhance the precision of fabricating memory cells. It is expected that the embedded bit lines 152 can be much narrower than conventional raised bit lines that extend over the base dielectric layer and the bit line contacts. Additionally, by providing spacers along the sides of the bit lines to electrically isolate the bit lines from the cell plugs, the bit lines can be embedded in the narrow, elongated pathways between the cell plugs. The narrow, embedded bit lines are expected to provide structures that allow a high-density of components to be fabricated in a memory cell or other structure. Additionally, because fewer photolithographic processes are necessary, the errors associated with photolithographic processes are reduced to further increase the precision of manufacturing small, high-density components.

Figure 16A:
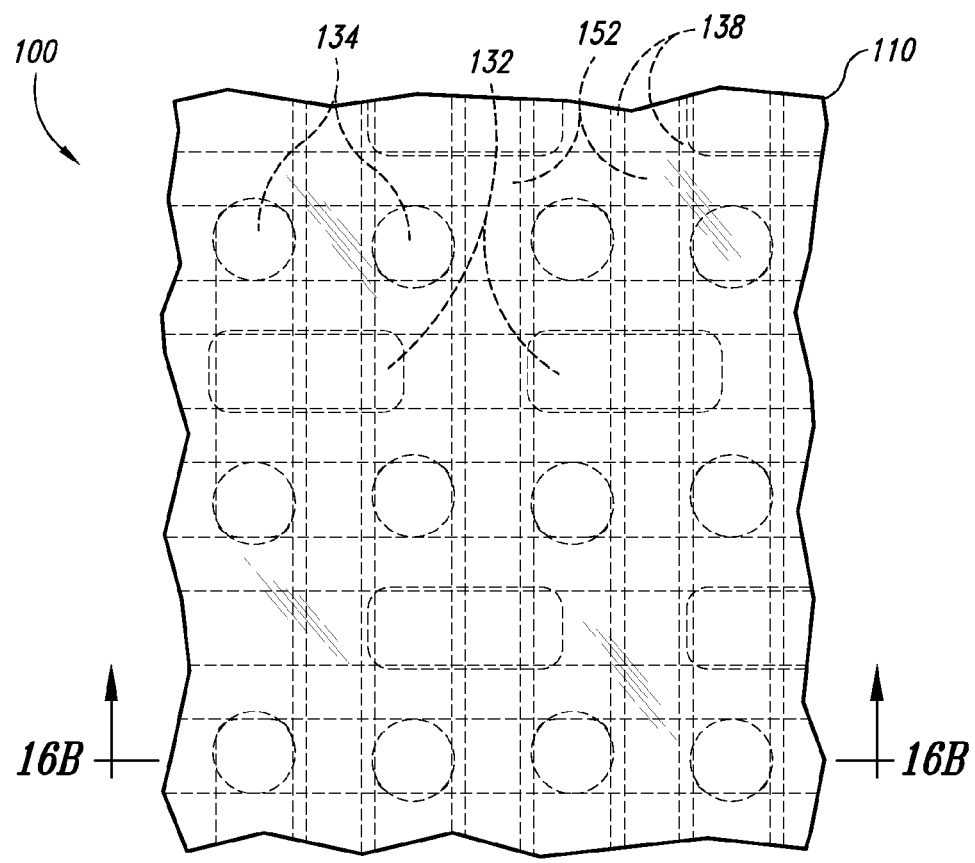
FIG. 16A is a schematic top plan view of the microelectronic device workpiece at a subsequent stage of the method for forming bit lines and contacts in a memory cell in accordance with an embodiment of the invention.
Figure 16B:
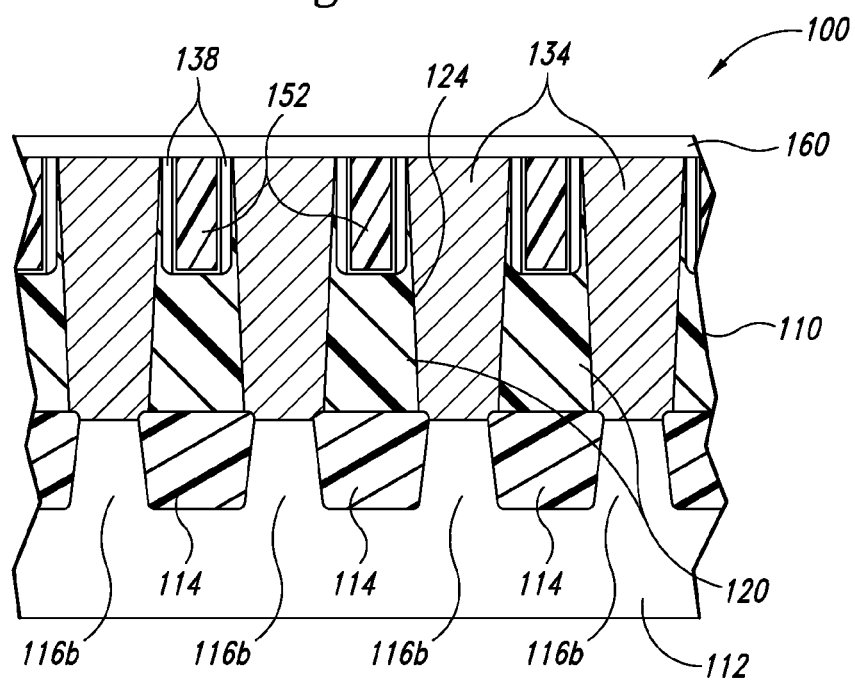
FIG. 16B is a schematic cross-sectional view of the microelectronic device workpiece of FIG. 16A taken along line 16-16.
Figure 17A:
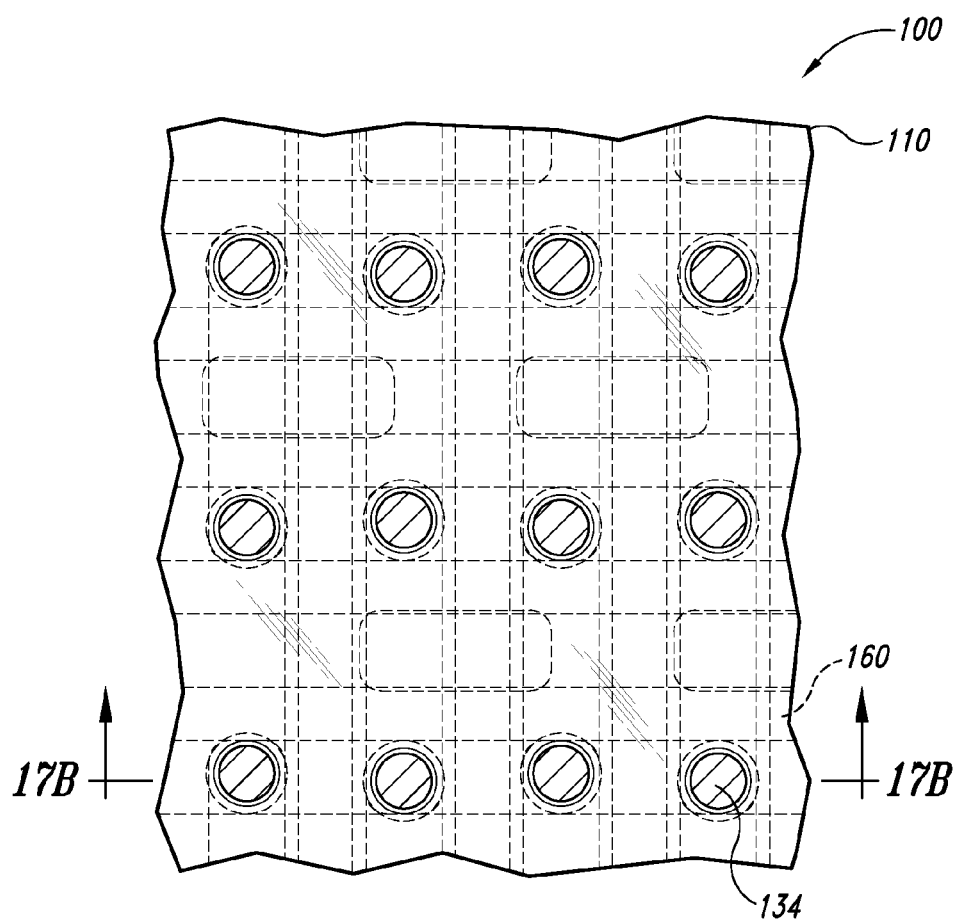
FIG. 17A is a schematic top plan view of the microelectronic device workpiece at a subsequent stage of the method for forming bit lines and contacts in a memory cell in accordance with an embodiment of the invention.
Figure 17B:
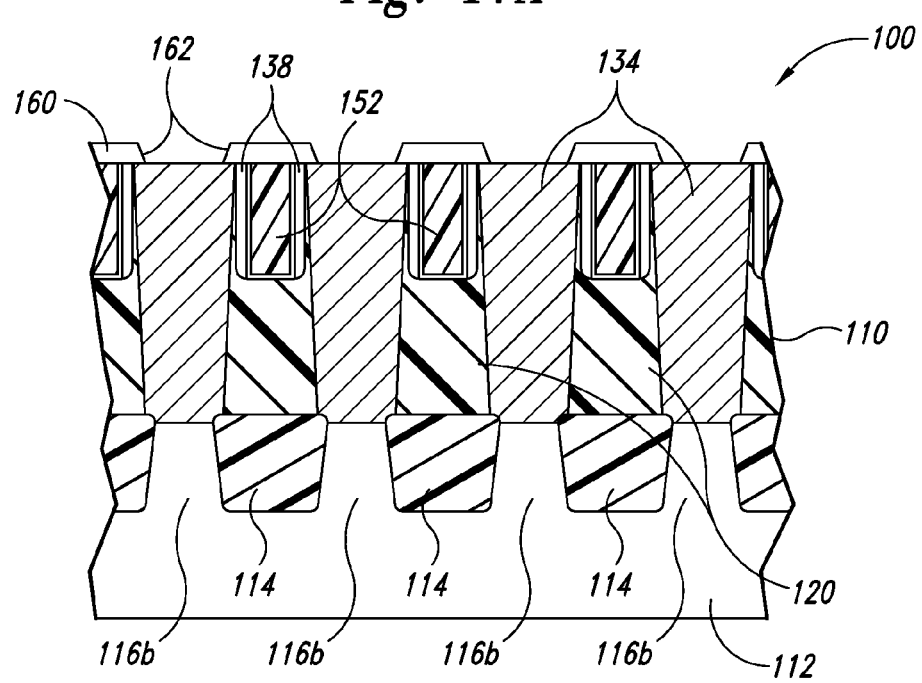
FIG. 17B is a schematic cross-sectional view of the microelectronic device workpiece of FIG. 17A taken along line 17-17.

FIGS. 16A-17B illustrate the workpiece 100 at subsequent stages of processing after forming the bit line contacts 132, cell plugs 134, and bit lines 152 shown in FIG. 15C. Referring to FIGS. 16A and 16B, a thin dielectric layer 160 is deposited over the workpiece 100. The dielectric layer 160 can be a layer of tetraethylorthosilicate (TEOS) or another suitable dielectric material. Referring to FIGS. 17A and 17B, a number of openings 162 can be formed in the second dielectric layer 160 using a photolithographic process. The second dielectric layer 160 can be quite thin relative to conventional designs (e.g., the dielectric layer 70 in FIG. 6B). The second dielectric layer 160 can be so thin because the bit lines 152, the bit line contacts 132 and the cell plugs 134 are all formed below the top surface 125 of the dielectric layer. The thin second dielectric layer 160 shown in FIG. 17B is expected to enhance the precision of the etching procedure for forming the openings 162 because the etching procedure does not need to etch through a relatively thick layer of material. Therefore, forming the embedded bit lines 152 further enhances the precision and repeatability of subsequent processes.

B. Embodiments of Additional Microelectronic Components

Figure 18:
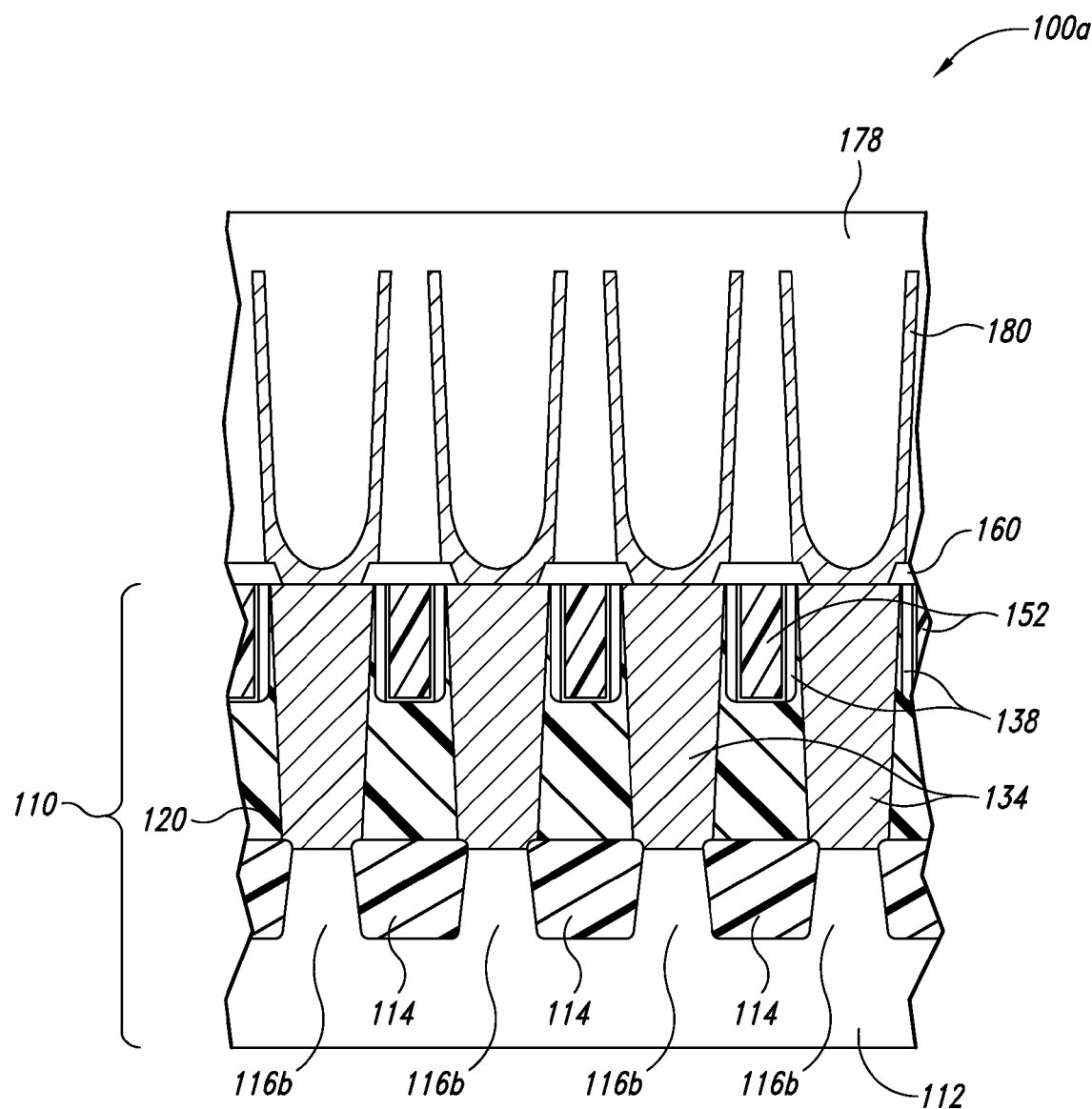
FIG. 18 is a schematic cross-sectional view of a microelectronic device in accordance with another embodiment of the invention.

FIG. 18 is a schematic cross-sectional view of a microelectronic workpiece 100a using the memory cell 110. The memory cell 110 is further processed by forming a top cell plate 170 and a bottom cell plate 180 over the memory cell 110. The bottom cell plate 180 can have polysilicon or other conductive members that contact the cell plugs 134. The top cell plate 170 is typically a dielectric layer that covers the bottom cell plate 180. The microelectronic workpiece 100a can then have other structures constructed on top of the top cell plate 170 to complete a memory device or other type of component.

Figure 19:
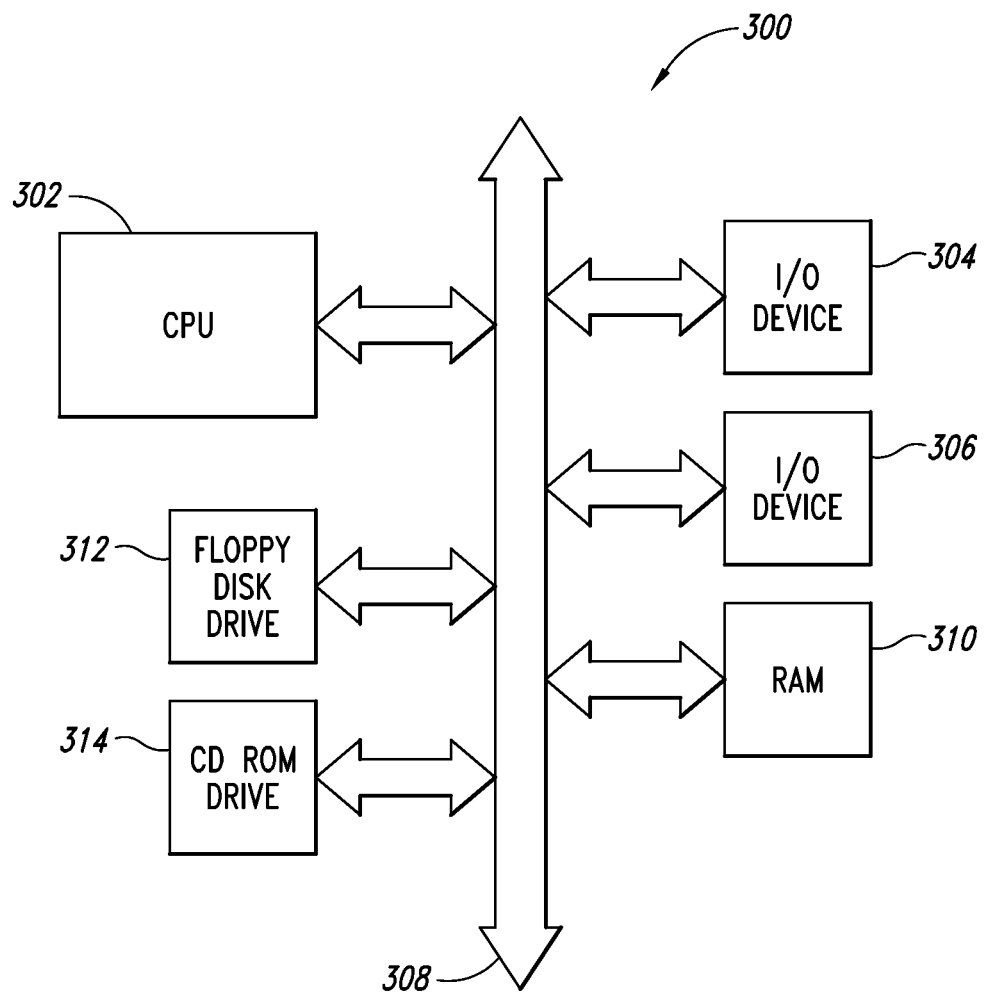
FIG. 19 is a schematic block diagram of a computer system in accordance with an embodiment of the invention.

FIG. 19 is a schematic block diagram of a computer system 300 in which the memory cells 110 described above with reference to FIGS. 9A-18 can be used. The computer system 300 comprises a microprocessor or central processing unit 302 that communicates with input/output (I/O) devices 304 and 306 over a bus 308. It will be appreciated that any number of I/O devices can be used, and that the selection of I/O devices depends upon the application for the computer system 300. The computer system 300 also includes random access memory (RAM) and peripheral devices, such as a floppy disk drive 312 and/or a compact disk (CD) ROM drive 314. The CPU communicates with the other foregoing devices over the bus 308. The computer system 300 is an example of a digital device that includes memory devices. Other types of dedicated processing systems include, for example, radio systems, television systems, GPS receiver systems, telephones, telephone systems, PDAs and other types of products.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of fabricating a component for a microelectronic device having a workpiece including a substrate, a plurality of active areas in the substrate, a plurality of shallow trench isolation structures in the substrate between active areas, a dielectric layer over the active areas, contacts in the dielectric layer contacting a first portion of the active areas and a portion of an adjacent shallow trench isolation structures, and conductors in the dielectric layer contacting a second portion of the active areas, the method comprising:

embedding an elongated conductive line in a trench extending through an upper portion of the contacts and sections of the dielectric layer between the contacts, the elongated conductive line being superimposed over portions of the shallow trench isolation structures but not over the first portion of the active areas; and electrically insulating the conductive line from the conductors by providing dielectric spacers in the trench between the conductive line and the conductors.

2. The method of claim 1 wherein embedding the elongated conductive line comprises using only two photolithographic and etching processes including (a) a first photolithographic and etching process to construct openings corresponding to the contacts and the conductors, and (b) a second photolithographic and etching process to form the trench through the upper portion the contacts.

3. The method of claim 1 wherein the trench includes first and second sidewalls, and wherein embedding the elongated conductive line comprises embedding the conductive line in the dielectric layer so that the first and second sidewalls of the trench are between the conductors.

4. The method of claim 1 wherein the trench includes first and second sidewalls, and wherein embedding the elongated conductive line comprises embedding the conductive line in the dielectric layer and the contacts so that (a) the first and second sidewalls of the trench are between conductors, and (b) the conductive line has a top surface at least substantially coplanar with a top surface of the dielectric layer.

5. The method of claim 1 wherein embedding the elongated conductive line comprises:

constructing contact openings and conductor openings comprises (a) a first photolithographic process that forms a pattern on the dielectric layer having apertures corresponding to a desired arrangement of the contact openings, and (b) etching the dielectric layer to form the contact openings; and forming the trench comprises (a) a second photolithographic process that forms an elongated slot corresponding to a location for the trench, and (b) etching the trench in the upper portions of the contacts and portions of the dielectric layer between the contacts.

6. The method of claim 1 wherein the trench includes first and second sidewalls, and wherein electrically insulating the conductive line comprises (a) depositing a thin, conformal layer of a dielectric material onto the first and second sidewalls and a bottom of the trench, and (b) removing the conformal dielectric material from the bottom of the trench to open a line plug and electrically isolate adjacent conductors.

7. The method of claim 1 wherein the trench includes first and second sidewalls, and wherein electrically insulating the conductive line comprises (a) depositing a thin, conformal layer of the dielectric material onto the sidewalls and a bottom of the trench, and (b) removing the conformal dielectric material from the bottom of the trench without a mask layer.

8. The method of claim 1 wherein the conductive line includes a first conductive material, and wherein the method further comprises:

depositing a barrier layer in the trench;

depositing a second conductive material over the barrier layer to fill the trench; and planarizing the workpiece to remove an overburden portion of the first and second conductive materials relative to the dielectric layer.

\* \* \* \* \*

UNITED STATES PATENT AND TRADEMARK OFFICE
CERTIFICATE OF CORRECTION

| | | |
|---|---|---|
| PATENT NO. | : 8,931,169 B2 | Page 1 of 1 |
| APPLICATION NO. | : 13/560836 | |
| DATED | : January 13, 2015 | |
| INVENTOR(S) | : Sanh Dang Tang | |

It is certified that error appears in the above-identified patent and that said Letters Patent is hereby corrected as shown below:

In the Claims

In column 11, line 44, in Claim 2, delete "portion the" and insert -- portion of the --, therefor.

Signed and Sealed this
Twenty-fourth Day of March, 2015

Michelle K. Lee
*Director of the United States Patent and Trademark Office*